United States Patent
Kumar et al.

(10) Patent No.: US 7,227,097 B2
(45) Date of Patent: Jun. 5, 2007

(54) PLASMA GENERATION AND PROCESSING WITH MULTIPLE RADIATION SOURCES

(75) Inventors: Satyendra Kumar, Troy, MI (US); Devendra Kumar, Rochester Hills, MI (US)

(73) Assignee: BTU International, Inc., N. Billerica, MA (US)

(*) Notice: Subject to any disclaimer, the term of this patent is extended or adjusted under 35 U.S.C. 154(b) by 446 days.

(21) Appl. No.: 10/430,415

(22) Filed: May 7, 2003

(65) Prior Publication Data

US 2004/0001295 A1  Jan. 1, 2004

Related U.S. Application Data

(60) Provisional application No. 60/378,693, filed on May 8, 2002, provisional application No. 60/430,677, filed on Dec. 4, 2002, provisional application No. 60/435,278, filed on Dec. 23, 2002.

(51) Int. Cl.
*B23K 10/00* (2006.01)

(52) U.S. Cl. ............ 219/121.43; 219/121.41; 219/121.48; 219/121.57; 156/345.38

(58) Field of Classification Search ............ 219/121.5, 219/121.36, 121.55, 121.43, 121.4, 121.46, 219/121.57; 150/345.38, 345.41; 118/724
See application file for complete search history.

(56) References Cited

U.S. PATENT DOCUMENTS

| | | | |
|---|---|---|---|
| 3,432,296 A | 3/1969 | McKinnon et al. | |
| 3,612,686 A | 10/1971 | Braman et al. | |
| 3,731,047 A | 5/1973 | Mullen et al. | |
| 4,004,934 A | 1/1977 | Prochazka | |
| 4,025,818 A | 5/1977 | Giguere et al. | |
| 4,090,055 A | 5/1978 | King | |
| 4,147,911 A | 4/1979 | Nishitani | |
| 4,151,034 A | 4/1979 | Yamamoto et al. | |
| 4,213,818 A | 7/1980 | Lemons et al. | |
| 4,230,448 A | 10/1980 | Ward et al. | |
| 4,265,730 A | 5/1981 | Hirose et al. | |
| 4,307,277 A | 12/1981 | Maeda et al. | |
| 4,339,326 A | 7/1982 | Hirose et al. | |
| 4,404,456 A | 9/1983 | Cann | |
| 4,473,736 A | 9/1984 | Bloyet et al. | |
| 4,479,075 A | 10/1984 | Elliott | |
| 4,500,564 A | 2/1985 | Enomoto | |
| 4,504,007 A | 3/1985 | Anderson, Jr. et al. | |
| 4,609,808 A | 9/1986 | Bloyet et al. | |
| 4,611,108 A | 9/1986 | Leprince et al. | |
| 4,624,738 A | 11/1986 | Westfall et al. | |

(Continued)

FOREIGN PATENT DOCUMENTS

DE  222 348 A1  5/1985

(Continued)

OTHER PUBLICATIONS

Accentus—http://www.accentus.co.uk/ipco/html/techenv6_txt_fr.html.

(Continued)

*Primary Examiner*—Mark Paschall
(74) *Attorney, Agent, or Firm*—Weingarten, Schurgin, Gagnebin & Lebovici LLP

(57) ABSTRACT

Plasma-assisted methods and apparatus that use multiple radiation sources are provided. In one embodiment, a plasma is ignited by subjecting a gas in a processing cavity to electromagnetic radiation having a frequency less than about 333 GHz in the presence of a plasma catalyst, which may be passive or active. A controller can be used to delay activation of one radiation source with respect to another.

30 Claims, 6 Drawing Sheets

U.S. PATENT DOCUMENTS

| | | | |
|---|---|---|---|
| 4,666,775 A | 5/1987 | Kim et al. | |
| 4,687,560 A | 8/1987 | Tracy | |
| 4,698,234 A | 10/1987 | Ovshinsky | |
| 4,760,230 A * | 7/1988 | Hassler | 219/750 |
| 4,767,902 A | 8/1988 | Palaith et al. | |
| 4,772,770 A | 9/1988 | Matsui et al. | |
| 4,792,348 A | 12/1988 | Pekarsky | |
| 4,840,139 A | 6/1989 | Takei | |
| 4,871,581 A | 10/1989 | Yamazaki | |
| 4,877,589 A | 10/1989 | O'Hare | |
| 4,877,938 A | 10/1989 | Rau et al. | |
| 4,883,570 A | 11/1989 | Efthimion et al. | |
| 4,888,088 A | 12/1989 | Slomowitz | |
| 4,891,488 A | 1/1990 | Davis et al. | |
| 4,908,492 A | 3/1990 | Okamoto et al. | |
| 4,919,077 A | 4/1990 | Oda et al. | |
| 4,924,061 A | 5/1990 | Labat et al. | |
| 4,946,547 A | 8/1990 | Palmour et al. | |
| 4,956,590 A | 9/1990 | Phillips | |
| 4,963,709 A | 10/1990 | Kimrey, Jr. | |
| 4,972,799 A | 11/1990 | Misumi et al. | |
| 5,003,152 A | 3/1991 | Matsuo | |
| 5,010,220 A | 4/1991 | Apte | |
| 5,015,349 A * | 5/1991 | Suib et al. | 204/168 |
| 5,017,404 A | 5/1991 | Paquet et al. | |
| 5,023,056 A | 6/1991 | Aklufi | |
| 5,058,527 A | 10/1991 | Ohta et al. | |
| 5,072,650 A | 12/1991 | Phillips | |
| 5,074,112 A | 12/1991 | Walton | |
| 5,085,885 A | 2/1992 | Foley et al. | |
| 5,087,272 A | 2/1992 | Nixdorf | |
| 5,103,715 A | 4/1992 | Phillips | |
| 5,120,567 A | 6/1992 | Frind et al. | |
| 5,122,633 A | 6/1992 | Moshammer | |
| 5,131,993 A | 7/1992 | Suib et al. | |
| 5,164,130 A | 11/1992 | Holcombe | |
| 5,202,541 A | 4/1993 | Patterson | |
| 5,222,448 A | 6/1993 | Morgenthaler et al. | |
| 5,223,308 A | 6/1993 | Doehler | |
| 5,224,117 A | 6/1993 | Kruger et al. | |
| 5,227,695 A | 7/1993 | Pelletier | |
| 5,271,963 A | 12/1993 | Eichman et al. | |
| 5,276,297 A | 1/1994 | Nara | |
| 5,276,386 A | 1/1994 | Watanabe | |
| 5,277,773 A | 1/1994 | Murphy | |
| 5,284,544 A | 2/1994 | Mizutani et al. | |
| 5,304,766 A | 4/1994 | Baudet et al. | |
| 5,307,892 A | 5/1994 | Phillips | |
| 5,310,426 A | 5/1994 | Mori | |
| 5,311,906 A | 5/1994 | Phillips | |
| 5,316,043 A | 5/1994 | Phillips | |
| 5,321,223 A | 6/1994 | Kimrey | |
| 5,349,154 A | 9/1994 | Harker et al. | |
| 5,366,764 A | 11/1994 | Sunthankar | |
| 5,370,525 A | 12/1994 | Godon | |
| 5,423,180 A | 6/1995 | Nobue et al. | |
| 5,435,698 A | 7/1995 | Phillips | |
| 5,449,887 A | 9/1995 | Holcombe | |
| 5,487,811 A | 1/1996 | Iizuka | |
| 5,505,275 A | 4/1996 | Phillips | |
| 5,514,217 A | 5/1996 | Niino | |
| 5,520,740 A | 5/1996 | Kanai | |
| 5,521,360 A | 5/1996 | Johnson et al. | |
| 5,523,126 A | 6/1996 | Sano | |
| 5,527,391 A | 6/1996 | Echizen et al. | |
| 5,536,477 A | 7/1996 | Cha et al. | |
| 5,597,456 A | 1/1997 | Maruyama et al. | |
| 5,607,509 A | 3/1997 | Schumacher | |
| 5,616,373 A | 4/1997 | Karner | |
| 5,637,180 A | 6/1997 | Gosain et al. | |
| 5,645,897 A | 7/1997 | Andra | |
| 5,651,825 A | 7/1997 | Nakahigashi et al. | |
| 5,662,965 A | 9/1997 | Deguchi | |
| 5,670,065 A | 9/1997 | Bickmann et al. | |
| 5,671,045 A | 9/1997 | Woskov | |
| 5,682,745 A | 11/1997 | Phillips | |
| 5,688,477 A | 11/1997 | Nel | |
| 5,689,949 A | 11/1997 | DeFreitas | |
| 5,712,000 A | 1/1998 | Wei et al. | |
| 5,714,010 A | 2/1998 | Matsuyama et al. | |
| 5,715,677 A | 2/1998 | Wallman et al. | |
| 5,734,501 A | 3/1998 | Smith | |
| 5,735,451 A | 4/1998 | Mori | |
| 5,741,364 A | 4/1998 | Kodama | |
| 5,755,097 A | 5/1998 | Phillips | |
| 5,794,113 A | 8/1998 | Munir et al. | |
| 5,796,080 A | 8/1998 | Jennings | |
| 5,808,282 A | 9/1998 | Apte | |
| 5,828,338 A | 10/1998 | Gerstenberg | |
| 5,841,237 A | 11/1998 | Alton | |
| 5,847,355 A | 12/1998 | Barmatz et al. | |
| 5,848,348 A | 12/1998 | Dennis | |
| 5,859,404 A | 1/1999 | Wei | |
| 5,868,871 A | 2/1999 | Yokose et al. | |
| 5,874,705 A | 2/1999 | Duan | |
| 5,904,993 A | 5/1999 | Takeuchi | |
| 5,939,026 A | 8/1999 | Seki et al. | |
| 5,945,351 A | 8/1999 | Mathuni | |
| 5,961,773 A | 10/1999 | Ichimura et al. | |
| 5,961,871 A | 10/1999 | Bible et al. | |
| 5,973,289 A | 10/1999 | Read et al. | |
| 5,976,429 A | 11/1999 | Chen | |
| 5,980,843 A | 11/1999 | Silversand | |
| 5,980,999 A | 11/1999 | Goto et al. | |
| 5,989,477 A | 11/1999 | Berger | |
| 5,993,612 A | 11/1999 | Rostaing et al. | |
| 5,998,774 A | 12/1999 | Joines et al. | |
| 6,011,248 A | 1/2000 | Dennis | |
| 6,028,393 A | 2/2000 | Izu | |
| 6,038,854 A | 3/2000 | Penetrante et al. | |
| 6,039,834 A | 3/2000 | Tanaka et al. | |
| 6,054,693 A | 4/2000 | Barmatz et al. | |
| 6,054,700 A | 4/2000 | Rokhvarger | |
| 6,096,389 A | 8/2000 | Kanai | |
| 6,101,969 A | 8/2000 | Niori | |
| 6,103,068 A | 8/2000 | Merten et al. | |
| 6,121,109 A | 9/2000 | Chen et al. | |
| 6,122,912 A | 9/2000 | Phillips | |
| 6,131,386 A | 10/2000 | Trumble | |
| 6,132,550 A | 10/2000 | Shiomi | |
| 6,139,656 A | 10/2000 | Wilkosz et al. | |
| 6,149,985 A | 11/2000 | Grace et al. | |
| 6,152,254 A | 11/2000 | Phillips | |
| 6,153,868 A | 11/2000 | Marzat | |
| 6,183,689 B1 | 2/2001 | Roy et al. | |
| 6,186,090 B1 | 2/2001 | Dotter | |
| 6,189,482 B1 | 2/2001 | Zhao | |
| 6,204,190 B1 | 3/2001 | Koshido | |
| 6,204,606 B1 | 3/2001 | Spence | |
| 6,224,836 B1 | 5/2001 | Moisan et al. | |
| 6,228,773 B1 | 5/2001 | Cox | |
| 6,238,629 B1 | 5/2001 | Barankova et al. | |
| 6,248,206 B1 | 6/2001 | Herchen et al. | |
| 6,264,812 B1 | 7/2001 | Raaijmakers et al. | |
| 6,284,202 B1 | 9/2001 | Cha et al. | |
| 6,287,980 B1 | 9/2001 | Hanazaki et al. | |
| 6,287,988 B1 | 9/2001 | Nagamine et al. | |
| 6,297,172 B1 | 10/2001 | Kashiwagi | |
| 6,297,595 B1 | 10/2001 | Stimson | |
| 6,329,628 B1 | 12/2001 | Kuo | |
| 6,342,195 B1 | 1/2002 | Roy et al. | |
| 6,345,497 B1 | 2/2002 | Penetrante et al. | |
| 6,348,158 B1 * | 2/2002 | Samukawa | 216/67 |
| 6,358,361 B1 | 3/2002 | Matsumoto | |

| | | | | | | |
|---|---|---|---|---|---|---|
| 6,362,449 B1 | 3/2002 | Hadidi | | JP | 09-027482 A | 1/1997 |
| 6,365,885 B1 | 4/2002 | Roy et al. | | JP | 09-078240 A | 3/1997 |
| 6,367,412 B1 | 4/2002 | Ramaswamy et al. | | JP | 09-102400 A | 4/1997 |
| 6,370,459 B1 | 4/2002 | Phillips | | JP | 09-102488 A | 4/1997 |
| 6,372,304 B1 | 4/2002 | Sano et al. | | JP | 09-111461 A | 4/1997 |
| 6,376,027 B1 | 4/2002 | Lee et al. | | JP | 09-137274 A | 5/1997 |
| 6,383,333 B1 | 5/2002 | Haino et al. | | JP | 09-157048 A | 6/1997 |
| 6,383,576 B1 | 5/2002 | Matsuyama | | JP | 09-223596 A | 8/1997 |
| 6,388,225 B1 | 5/2002 | Blum et al. | | JP | 09-235686 A | 9/1997 |
| 6,392,350 B1 | 5/2002 | Amano | | JP | 09-251971 A | 9/1997 |
| 6,407,359 B1 | 6/2002 | Lagarde et al. | | JP | 09-295900 A | 11/1997 |
| 6,488,112 B1 | 12/2002 | Kleist | | JP | 10-066948 A | 3/1998 |
| 6,512,216 B1 | 1/2003 | Gedevanishvili et al. | | JP | 10-081588 A | 3/1998 |
| 6,522,055 B1 | 2/2003 | Uemura et al. | | JP | 10-081970 A | 3/1998 |
| 6,575,264 B1 | 6/2003 | Spadafora | | JP | 10-087310 A | 4/1998 |
| 6,592,664 B1 | 7/2003 | Frey et al. | | JP | 10-204641 A | 8/1998 |
| 6,717,368 B1 | 4/2004 | Skamoto et al. | | JP | 10-259420 A | 9/1998 |
| 6,870,124 B1 | 3/2005 | Kumar et al. | | JP | 10-294306 A | 11/1998 |
| 2001/0027023 A1 | 10/2001 | Ishihara et al. | | JP | 11-031599 A | 2/1999 |
| 2001/0028919 A1 | 10/2001 | Liu et al. | | JP | 11-106947 A | 4/1999 |
| 2002/0034461 A1 | 3/2002 | Segal | | JP | 11-145116 A | 5/1999 |
| 2002/0036187 A1 | 3/2002 | Ishll et al. | | JP | 11-186222 A | 7/1999 |
| 2002/0124867 A1 | 9/2002 | Kim et al. | | JP | 11-228290 A | 8/1999 |
| 2002/0135308 A1 | 9/2002 | Janos et al. | | JP | 11-265885 A | 9/1999 |
| 2002/0140381 A1 | 10/2002 | Golkowski et al. | | JP | 11-273895 A | 10/1999 |
| 2002/0190061 A1 | 12/2002 | Gerdes et al. | | JP | 11-297266 A | 10/1999 |
| 2002/0197882 A1 | 12/2002 | Niimi et al. | | JP | 2000-012526 A | 1/2000 |
| 2003/0071037 A1 | 4/2003 | Sato et al. | | JP | 2000-173989 A | 6/2000 |
| 2003/0111334 A1 | 6/2003 | Dodelet et al. | | JP | 2000-203990 A | 7/2000 |
| 2003/0111462 A1 | 6/2003 | Sato et al. | | JP | 2000-269182 A | 9/2000 |
| 2004/0001295 A1 | 1/2004 | Kumar et al. | | JP | 2000-288382 A | 10/2000 |
| 2004/0004062 A1 | 1/2004 | Kumar et al. | | JP | 2000-306901 A | 11/2000 |
| 2004/0070347 A1 | 4/2004 | Nishida et al. | | JP | 2000-310874 A | 11/2000 |
| 2004/0089631 A1 | 5/2004 | Blalock et al. | | JP | 2000-310876 A | 11/2000 |
| 2004/0107796 A1 | 6/2004 | Kumar et al. | | JP | 2000-317303 A | 11/2000 |
| 2004/0107896 A1 | 6/2004 | Kumar et al. | | JP | 2000-323463 A | 11/2000 |
| 2004/0118816 A1 | 6/2004 | Kumar et al. | | JP | 2000-348897 A | 12/2000 |
| | | | | JP | 2001-013719 A | 1/2001 |
| FOREIGN PATENT DOCUMENTS | | | | JP | 2001-053069 A | 2/2001 |
| DE | 195 42 352 A1 | 5/1997 | | JP | 2001-058127 A | 3/2001 |
| DE | 100 05 146 A1 | 8/2001 | | JP | 2001-093871 A | 4/2001 |
| EP | 0 228 864 B1 | 7/1987 | | JP | 2001-149754 A | 6/2001 |
| EP | 0 335 675 A2 | 10/1989 | | JP | 2001-149918 A | 6/2001 |
| EP | 0 436 361 A1 | 12/1990 | | JP | 2001-196420 A | 7/2001 |
| EP | 0 228 864 B1 | 3/1991 | | JP | 2001-303252 A | 10/2001 |
| EP | 0 420 101 A2 | 4/1991 | | JP | 2001-332532 A | 11/2001 |
| EP | 0 435 591 A | 7/1991 | | JP | 2001-351915 A | 12/2001 |
| EP | 0 436 361 A1 | 7/1991 | | JP | 2002-022135 A | 1/2002 |
| EP | 0 520 719 B1 | 12/1992 | | JP | 2002-028487 A | 1/2002 |
| EP | 0 670 666 B1 | 9/1995 | | JP | 2002-069643 A | 3/2002 |
| EP | 0 520 719 B1 | 5/1996 | | JP | 2002-075960 A | 3/2002 |
| EP | 0 724 720 B1 | 8/1996 | | JP | 2002-126502 A | 5/2002 |
| EP | 0 670 666 B1 | 6/1998 | | JP | 2002-273161 A | 9/2002 |
| EP | 0 724 720 B1 | 5/2000 | | JP | 2002-273168 A | 9/2002 |
| EP | 1 093 846 A1 | 4/2001 | | JP | 2003-075070 A | 3/2003 |
| EP | 1 427 265 A2 | 6/2004 | | JP | 2003-264057 A | 9/2003 |
| JP | 56-140021 A2 | 11/1981 | | WO | WO 95-11442 A1 | 4/1995 |
| JP | 57-119164 A2 | 7/1982 | | WO | WO 96/06700 A1 | 3/1996 |
| JP | 58-025073 A | 2/1983 | | WO | WO 96/38311 A1 | 12/1996 |
| JP | 59-103348 | 6/1984 | | WO | WO 97-13141 A1 | 4/1997 |
| JP | 59 169053 | 9/1984 | | WO | WO 01-55487 A2 | 8/2001 |
| JP | 59-169053 A | 9/1984 | | WO | WO 01-58223 A1 | 8/2001 |
| JP | 62-000535 A | 1/1987 | | WO | WO 01-82332 A1 | 11/2001 |
| JP | 04-74858 A | 3/1992 | | WO | WO 02-26005 A1 | 3/2002 |
| JP | 06-345541 A | 12/1994 | | WO | WO 02-026005 A1 | 3/2002 |
| JP | 07-153405 A | 6/1995 | | WO | WO 02-061165 A1 | 8/2002 |
| JP | 09-235686 A | 2/1996 | | WO | WO 02-061171 A1 | 8/2002 |
| JP | 08-217558 A | 8/1996 | | WO | WO 02-062114 A1 | 8/2002 |
| JP | 08-281423 A | 10/1996 | | WO | WO 02-062115 A1 | 8/2002 |
| JP | 09-017597 A | 1/1997 | | WO | WO 02-067285 A2 | 8/2002 |
| JP | 09-023458 A | 1/1997 | | WO | WO 02-067285 A3 | 8/2002 |
| JP | 09-027459 A | 1/1997 | | WO | WO 03-018862 A2 | 3/2003 |
| | | | | WO | WO 03-018862 A3 | 3/2003 |

| | | |
|---|---|---|
| WO | WO 03-028081 A2 | 4/2003 |
| WO | WO 03-095058 A2 | 11/2003 |
| WO | WO 03-095089 A1 | 11/2003 |
| WO | WO 03-095090 A1 | 11/2003 |
| WO | WO 03-095130 A1 | 11/2003 |
| WO | WO 03-095591 A1 | 11/2003 |
| WO | WO 03-095699 A1 | 11/2003 |
| WO | WO 03-095807 A1 | 11/2003 |
| WO | WO 03-096369 A1 | 11/2003 |
| WO | WO 03-096370 A1 | 11/2003 |
| WO | WO 03-096380 A2 | 11/2003 |
| WO | WO 03-096381 A2 | 11/2003 |
| WO | WO 03-096382 A2 | 11/2003 |
| WO | WO 03-096383 A2 | 11/2003 |
| WO | WO 03-096747 A2 | 11/2003 |
| WO | WO 03-096749 A1 | 11/2003 |
| WO | WO 03-096766 A1 | 11/2003 |
| WO | WO 03-096768 A1 | 11/2003 |
| WO | WO 03-096770 A1 | 11/2003 |
| WO | WO 03-096771 A1 | 11/2003 |
| WO | WO 03-096772 A1 | 11/2003 |
| WO | WO 03-096773 A1 | 11/2003 |
| WO | WO 03-096774 A1 | 11/2003 |
| WO | WO 04-050939 A2 | 6/2004 |

OTHER PUBLICATIONS

Agrawal et al., "Grain Growth Control in Microwave Sintering of Ultrafine WC-Co Composite Powder Compacts," Euro PM99, Sintering, Italy, 8 pages (1999).

Agrawal et al., "Microwave Sintering of Commercial WC/Co Based Hard Metal Tools," Euro PM99, Sintering, Italy, 8 pages (1999).

Agrawal, D., "Metal Parts from Microwaves," 2 pages.

Agrawal, D., "Microwave Processing of Ceramics," *Current Opinion in Solid State and Material Science*, 3:480-485 (1998).

Air Liquide, Heat Treatment—Gas Quenching,—http://www.airliquide.com/en/business/industry/metals/applications/heat_treatment/quenching, 1 page (2000).

Alexander et al., "Electrically Conducive Polymer Nanocomposite Materials," AFRL's Materials and Manufacturing Directorate, Non-metallic Materials Division, Polymer Branch, Wright-Patterson AFB OH—http://www.afrlhorizons.com/Briefs/Sept02/ML0206.html, 2 pages (Sep. 2002).

Al-Shamma'a et al., "Microwave Atmospheric Plasma for Cleaning Exhaust Gases and Particulates," University of Liverpool, Dept. of Electrical Engineering and Electronics.

Alton et al., "A High-Density, RF Plasma-Sputter Negative Ion Source," 3 pages.

Anklekar et al., Microwave Sintering And Mechanical Properties of PM Copper Steel, pp. 355-362 (2001).

Batanov et al., "Plasmachemical Deposition of Thin Films in a Localized Free-Space Microwave Discharge," *Technical Physics*, 38:6, pp. 475-479 (1993).

Carbonitriding, Treat All Metals, Inc., 2 pages—http://www.treatallmetals.com/carbon.htm.

Carburizing,—Heat Treating by Treat All Metals—http://www.treatallmetals.com/gas.htm, 2 pages.

Cheng et al., "Microwave Processing of WC-Co Composites And Ferroic Titanates" (Original Article), *Mat Res Innova* (1):44-52 (1997).

Cheng, J., "Fabricating Transparent Ceramics by Microwave Sintering," *Focus on Electronics*, 79:9, pp. 71-74 (2000).

Circle Group Holdings, Inc. eMentor Companies "StarTech Environmental Corp."—http://www.crgq.com/cgiweb/HTML/eMentor_Companies/startech.html, 9 pages.

Classification of Cast Iron—Key to Steel—Article—http://www.key-to-steel.com/Articles/Art63.htm, 3 pages.

Collin, *Foundations for Microwave Engineering*, 2d Ed., IEEE Press, NY, pp. 180-192 (2001).

Controlled Atmosphere Sinter-Hardening, 2 pages.

Egashira,. "Decomposition of Trichloroethylene by Microwave-induced Plasma Generated from SiC whiskers," *J. Electrochem. Soc.*, 145:1, pp. 229-235 (Jan. 1998).

Ford 1.3L Catalytic Converter (1988-1989)—http://catalytic-converters.com/FO13L43778889.html, 1 page.

Ford Contour Catalytic Converter (1995-1996)—http://www.all-catalytic-converters.com/ford-contour-converter.html, 2 pages.

Fraunhofer ILT, "Plasma-Reactors for Aftertreatment of Automobile Exhaust Gas," Fraunhofer-Gesellschaft (2002)—http://www.ilt.fhg.de/eng/jb01-s35.html, 1 page.

French, "The Plasma Waste Converter—From Waste Disposal to Energy Creation,"—http://www.arofe.army.mil/Conferences/CWC2001/French.htm, p. 1.

Gao et al., "Superfast Densification of Oxide/Oxide Ceramic Composites," *J. Am. Ceram. Soc.* 82[4]1061-63 (1999)—http://216.239.39.100/search?q=cache:b-TFhQInU6YC:www.umr.edu/~hruiz/GaoShen.ppt+spark+plasma.

Gedev Anishvili et al., "Microwave Combustion Synthesis And Sintering of Intermetallics And Alloys," *Journal of Materials Science Letters*, (18), pp. 665-668 (1999).

General Eastern, Semiconductor Manufacturing—Using the HygroTwin 2850 to Reduce Costs, Improve Quality, TIM 003, 3 pages, (1997).

George, S.J., "The Catalytic Converter," 5 pages, (2002)—http://krioma.net/Articles/Catalytic%20Converter/Catalytic%20Converter.html.

GlassTesseract.Org—The Home of Kenz Benz, "Tech Procedures and Tips: Exhaust Manifolds and Catalytic Converters Removal—and Installation", 4 pages (2003)—http://glasstesseract.org/tech/catalytic.html.

Grant, J., Hackh's Chemical Dictionary, 3rd ed. p. 174-175.

Holt Walton & Hill, Heat Treatment of Steels—The Processes, Azom.com, 9 pages, (2002).

Holt Walton & Hill, Powder Metallurgy—Overview of the Powder Metallurgy Process, Azom.com, 3 pages (2002)—http://www.azom.com/details.asp?ArticleID=1414.

Honda Automobile News Press Release, "Honda Introduces Its First Two Clean Air Vehicles, the Civic Ferio LEV and Partners 1.6 LEV", 3 pages (Feb. 1997)—http://world.honda.com/news/1997/4970217a.html.

Honda Civic CX Catalytic Converter, 1 page (1996-2000)—http://www.catalyticconverters.com/HOCIVICCX4349600.html.

How A Blast Furnace Works—The Blast Furnace Plant, AISI Learning Center: http://www.steel.org/learning/howmade/blast_furnace.htm.

How Is Steel Made, Answer Discussion, 6 pages—http://ourworld.compuserve.com/homepages/Dyaros/stlmanuf.htm.

HSU et al., "Palladium-Coated Kieselguhr for Simultaneous Separation and Storage of Hydrogen," Westinghouse Savannah River Company, U.S. Dept. of Commerce, National Technical Information Service, 14 pages (2001).

Hydrogen Separation Membrane,—Advanced Gas Separation: H2 Separation, 1 page (2001).

IRC in Materials Processing, "Advanced Melting, Atomisation, Powder and Spray Forming, Plasma Melting—Operation of a Plasma Furnace," University of Birmingham, 3 pages—http://www.irc.bham.ac.uk/theme1/plasma/furnace.htm.

*Iron and Steel*, 6:(16-22).

Japanese Advanced Environment Equipment, "Waste and Recycling Equipment—Mitsubishi Graphi Electrode Type Plasma Furnace," 3 pages—http://nett21.unep.or.jp/JSIM_DATA/WASTE/WASTE_3/html/Doc_467.html.

Johnson, D.L., "Fundamentals of Novel Materials Processing," Dept. of Materials Science & Engineering, Northwestern University, 2 pages—http://www.matsci.northerwestern.edu/faculty/dlj.html.

Kalyanaraman et al., "Synthesis and Consolidation of Iron Nanopowders," *NanoStructured Materilas*, vol. 10, No. 8, pp. 1379-1392 (1998).

Karger, Odo—Area of Work: Microwave Welding, 2 pages (Nov. 2002).

Kong et al., "Nuclear-Energy-Assisted Plasma Technology for Producing Hydrogen," Nuclear Energy Research Initiative, 4 pages (2002).

Lewis, R. J. Sr., "Hawley's Condensed Chemical Dictionary," 12th ed., p. 230-232 (1993).

Lucas, J., "Welding Using Microwave Power Supplies," Computer Electronics & Robotics—http://www.liv.ac.uk/IEEE/research/cer/project6.htm.

Luggenholscher et al., "Investigations on Electric Field Distributions in a Microwave Discharge in Hydrogen," Institute fur Laser- und Plasmaphysik, Univsitat Essen, Germany, 4 pages.

Microelectronics Plasma Applications,—March Plasma Systems, 2 pages (2002)—http://www.marchplasma.com/micro_app.htm.

Micro-fabricated Palladium-Silver Membrane for Hydrogen Separation and Hydro/Dehydrogenation Reactions, Research Education Group, 5 pages—http://utep.el.utwente.nl/tt/projects/sepmem/.

Microwave Joining of Alumina and Zirconia Ceramics, IRIS, Research Topics 1998, 1 page.

Microwave Welding (EWi Welding Network) 1 page—http://www.ferris.edu/cot/accounts/plastics/ htdocs/Prey/Microwave%20Homepage.htm.

Microwave Welding of Plastics, TWI World Centre for Materials Joining Technology, 2 pages, (Aug. 2002)—http://www.twi.co.uk/j32k/protected/band_3/ksab001.htm.

Microwave Welding, Welding and Joining Information Network, 3 pages (Nov. 2002)—http://www.ewi.org/technologies/plastics/microwave.asp.

Moss et al., "Experimental Investigation of Hydrogen Transport Through Metals," Los Alamos National Library, 5 pages—http://www.education.lanl.gov/RESOURCES/h2/dye/education.html.

Nitriding, Treat All Metals, Inc., 2 pages -http://www.treatallmetals.com/nitrid.htm.

Non-Thermal Plasma Aftertreatment of Particulates—Theoretical Limits and Impact on Reactor Design, 27 pages—http://www.aeat.com/electrocat/sae/intro . . .references.htm.

Office of Energy Efficiency, "Using Non-Thermal Plasma Reactor to Reduce NOx Emissions from CIDI Engines," 1 page (Apr. 1999).

Optoelectronic Packaging Applications, March Plasma Systems, 2 pages (2002)—http://www.marchplasma.com/opto_app.htm.

Paglieri et al., "Palladium Alloy Composite Membranes for Hydrogen Separation," Abstract, Los Alamos National Library, 5 pages.

Peelamedu et al., "Anisothermal Reaction Synthesis of Garnets, Ferrites, And Spinels In Microwave Field," *Materials Research Bulletin* (36):2723-2739 (2001).

PerfectH2TM PE8000 Series, "Palladium Diffusion Hydrogen Purifier For High Flow Rate MOCVD Applications" Matheson Tri.Gas, 2 pages (2002).

Photonics Dictionary, "Definition for Word(s): Thyratron" (Laurin Publishing), 2 pages (1996-2003)—http://www.photonics.com/dictionary/lookup/lookup.asp?url=lookup&entrynum=538.

Pingel, V.J., "About What Every P/A Should Know About P/M," Powder Metallurgy Co., 9 pages—http://www.powdermetallurgyco.com/pm_about.htm.

Plasma Applications, Coalition for Plasma Science, 2 pages (1999, 2000)—http://www.plasmacoalition.org/applications.htm.

Plasma Carburizing, 1 page—http://www.ndkinc.co.jp/ndke04.html.

Plasma Direct Melting Furnace, Materials Magic, Hitachi Metals Ltd., 3 pages—http://www.hitachi-metals.co.jp/e/prod/prod07/p07_2_02.html.

Plasma Electronics, Classical Plasma Applications, 2 pages (2002)—http://www.plasma.iinpe.br/English/Classical_Applications.htm.

Plasma Nitride Process Description, Northeast Coating Technologies, 2 pages.

Plasma Science and Technology, "Plasmas for Home, Business and Transportation," p. 4—http://www.plasmas.org/rot-home.htm.

Plasma-Assisted Catalyst Systems, Novel Plasma Catalysts Significantly Reduce NOx from Diesel Engines, 2 pages (Apr. 2001)—http://www.ott.doe.gov/success.html (2 pages).

Printed Circuit Board (PCB) Plasma Applications, March Plasma Systems, 2 pages (2002)—http://www.marchplasma.com/pcb_app.01.htm.

Roy et al., "Full Sintering of Powdered-Metal Bodies In A Microwave Field," *Nature*, vol. 399, pp. 668-670 (Jun. 17, 1999).

Roy et al., "Microwave Processing: Triumph of Applications-Driven Science in WC-Composites And Ferroic Titanates," *Ceramic Transactions*, vol. 80, pp. 3-26, (1997).

Roy et al., "Definitive Experimental Evidence for Microwave Effects: Radically New Effects of Separated E and H Fields, Such As Decrystallization of Oxides in Seconds," *Materials Research Innovations*, Springer-Verlag, vol. 6, No. 3, pp. 129-140 (2002).

Roy et al., "Major phase transformations and magnetic property changescaused by electromagnetic fields at microwave frequencies," *Journal Of Material Research*, 17:12, pp. 3008-3011 (2002).

Rusanov, V. D., Hydrogen Energy & Plasma Technologies Institute: Russian Research Centre Kurchatov Institute, 13 pages,—http://www.kiae.ru/eng/str/ihept/oiivept.htm.

Samant et al., "Glow Discharge Nitriding A1 6063 Samples and Study of Their Surface Hardness," Metallofizika I Noveishe Takhnologii, 23(3), pp. 325-333 (2001).

Sato et al., Surface Modifications of Pure Iron by RF Plasma Nitriding with DC Bias Voltage Impression, *Hyomen Gijutsu* 48(3), pp. 317-323 (1997) (English Abstract).

Saveliev Y. "Effect of Cathode End Caps and a Cathode Emissive Surface on Relativistic Magnetron Operation," *IEEE Transactions on Plasma Science*, 28:3, pp. 478-484 (Jun. 2000).

SC/Tetra Engine Manifold Application, 2 pages (2001)—http://www.sctetra.com/applications/01_manifold.htm.

Shulman et al., "Microwaves In High-Temperature Processes," GrafTech, 8 pages (Mar. 2003) http://www.industrialheating.com/CDA/ArticleInformation/features/BNP_Features_Item/0,2832,94035,00.html.

Slone et al., "Nox Reduction For Lean Exhaust Using Plasma Assisted Catalysis," NOXTECH Inc., 5 pages (2000)—http://www.osti.gov/fcvt/deer2000/bhattpa.pdf.

Stockwell Rubber Company, Inc., "Conductive Silicone Rubber Compounds Product Selection Guide," Electrically Conductive Materials, 3 pages—http://www.stockwell.com/electrically_conductive_produc.htm.

Sumitomo Heavy Industries, Ltd., "Spark Plasma Sintering—What is Spark Plasma Sintering," 3 pages (2001)—http://www.shi.co.jp/sps/eng/.

Surface Hardening AHS Corp., 5 pages—http://www.ahscorp.com/surfaceh.html.

Takizawa et al. "Synthesis of inorganic materials by 28 GHz MW radiation," Proceed. Of The Symposium On Mw Effects And Applications, Aug. 2, 2001, Kokushikau Univ., Tokyo, Japan, pp. 52-53, (2001).

Taube et al. "Advances in Design of Microwave Resonance Plasma Source," American Institute of Chemical Engineering, 2004 Annual Meeting, Presentation (Nov. 2004).

TestMAS: Pressure Sintering, 11 pages—http://cybercut.berkley.edu/mas2/processes/sinter_pressure.

The Amazing Metal Sponge: Simulations of Palladium-Hydride, Design of New Materials, 3 pages—http://www.psc.edu/science/Wolf/Wolf.html.

Toyota Motor Sales, "Emission Sub Systems—Catalytic Converter," 10 pages.

Uchikawa et al., "New Technique of Activating Palladium Surface for Absorption of Hydrogen or Deuterium," *Japanese Journal of Applied Physics*, vol. 32 (1993), pp. 5095-5096, Part 1, No. 11A (Nov. 1993).

Wang et al., "Densification of A12O3 Powder Using Spark Plasma Sintering," *J. Mater. Res.*, 15:4, pp. 982-987 (Apr. 2000).

Way et al., "Palladium/Copper Allow Composite Membranes for High Temperature Hydrogen Separation from Coal-Derived Gas Streams," Dept. of Chemical Engineering, Colorado School of Mines, 3 pages (1999).

Welding Breakthrough: Generating and Handling a Microwave Powered Plasma, Australian Industry News, Information & Suppliers, 7 pages (Sep. 2001)—http://www.industry/search.com.au/features/microwave.asp.

Welding Plastic Parts, Business New Publishing Company, 4 pages (Nov. 2002)—http://www.assemblymag.com/Common/print_article.asp?rID=E455512C17534C31B96D.

Xie et al., "Effect of Rare Earth in Steel on Thermochemical Treatment," Xiuou Jinshu Cailiao Yu Gongcheng, 26(1), pp. 52-55 (Feb. 1997) (English Abstract).

Yahoo Canada—Autos, "Catalytic Converter Answer2," 4 pages (2001)—http://ca.autos.yahoo.com/maintain/catalytic_converteranswer2.html.
International Search Report issued on Jun. 26, 2003, in PCT/US03/14037.
International Search Report issued on Jul. 8, 2003, in PCT/US03/14124.
International Search Report issued on Jun. 24, 2003, in PCT/US03/14132.
International Search Report issued on Jul. 29, 2003, in PCT/US03/14052.
International Search Report issued on Jul. 29, 2003, in PCT/US03/14054.
International Search Report issued on Apr. 27, 2004, in PCT/US03/14036.
International Search Report issued on Aug. 21, 2003, in PCT/US03/14053.
International Search Report issued on Feb. 8, 2004, in PCT/US03/14034.
International Search Report issued on Aug. 29, 2003, in PCT/US03/14039.
International Search Report issued on Aug. 21, 2003, in PCT/US03/14038.
International Search Report issued on Aug. 24, 2003, in PCT/US03/14133.
International Search Report issued on Jul. 28, 2003, in PCT/US03/14035.
International Search Report issued on Jun. 27, 2003, in PCT/US03/14040.
International Search Report issued on Jul. 17, 2003, in PCT/US03/14134.
International Search Report issued on Jun. 27, 2003, in PCT/US03/14122.
International Search Report issued on Jun. 24, 2003, in PCT/US03/14130.
International Search Report issued on Apr. 30, 2004, in PCT/US03/14055.
International Search Report issued on Apr. 30, 2004, in PCT/US03/140137.
International Search Report issued on Aug. 21, 2003, in PCT/US03/14123.
International Search Report issued on Jul. 29, 2003, in PCT/US03/14121.
International Search Report issued on Aug. 24, 2003, in PCT/US03/14136.
International Search Report issued on May 3, 2004, in PCT/US03/14135.
Written Opinion issued on Apr. 13, 2004, in PCT/US03/014037.
Examination Report issued on Feb. 24, 2004, in PCT/US03/14054.
Written Opinion issued on Dec. 22, 2003, in PCT/US03/14053.
Examination Report issued on Apr. 26, 2004, in PCT/US03/14053.
Written Opinion issued on Dec. 22, 2003, in PCT/US03/14123.
Examination Report issued on Apr. 26, 2004, in PCT/US03/14123.
Quayle Action issued on Apr. 19, 2005, in U.S. Appl. No. 10/449,600.
Quayle Action issued on Apr. 19, 2004, in U.S. Appl. No. 10/430,414.
Office Action issued on May 18, 2004, in U.S. Appl. No. 10/430,426.
Reply to Office Action filed on Nov. 18, 2004, in U.S. Appl. No. 10/430,426.
Office Action issued on Feb. 24, 2005, in U.S. Appl. No. 10/430,426.
Office Action issued in U.S. Appl. No. 10/430,416 on Nov. 10, 2005.
Willert-Porada, M., "Alternative Sintering Methods" 1 page Abstract dated Nov. 8, 2001, http://www.itap.physik.uni-stuttgart.de/~gkig/neu/english/welcome.php?/-gkig/neu/abstracts/abstract_willert-porada.html.
Accentus Corporate Overview, 3 pages—http://www.accentus.co.uk/ipco/html/techenv6_txt_fr.html (2003).
Agrawal, "Metal Parts from Microwaves," *Materials World* 7(11):672-673 (1999).
Agrawal, "Microwave Processing of Ceramics," *Current Opinion in Solid State and Materials Science* 3:480-485 (Oct. 1998).
Air Liquide, "Heat Treatment—Gas Quenching,"—http://www.airliquide.com/en/business/industry/metals/applications/heat_treatment/quenching.asp, 1 page (2000).
Alexander et al., "Electrically Conductive Polymer Nanocomposite Materials," AFRL's Materials and Manufacturing Directorate, Non-metallic Materials Division, Polymer Branch, Wright-Patterson AFB OH—http://www.afrlhorizons.com/Briefs/Sept02/ML0206.html , 2 pages (Sep. 2002).
Al-Shamma'a et al., "Microwave Atmospheric Plasma for Cleaning Exhaust Gases and Particulates," Future Car Congress, Washington, Jun. 3-5, 2002 (1 page).
Alton et al., "A High-Density, RF Plasma-Sputter Negative Ion Source," The 8th Intl. Conf. on Heavy-Ion Accelerator Technology, Argonne Natl. Lab., Oct. 5-9, 1998, Poster Presentation (3 pages).
Anklekar et al., "Microwave Sintering and Mechanical Properties of PM Copper Steel," *Powder Metallurgy* 44(4):355-362 (2001).
"Carbonitriding," Treat All Metals, Inc., 2 pages—http://www.treatallmetals.com/carbon.htm.
"Carburizing," Treat All Metals, Inc.—http://www.treatallmetals.com/gas.htm, 2 pages.
Cheng, J., "Fabricating Transparent Ceramics by Microwave Sintering," *Am. Ceramic Soc. Bull.* 79(9):71-74 (2000).
Cheng et al., "Microwave Processing of WC-Co Composites And Ferroic Titanates" *Mat. Res. Innovat.* 1(1):44-52 (Jun. 1997).
Circle Group Holdings, Inc., "StarTech Environmental Corp."—http://www.crgq.com/cgiweb/HTML/eMentor_Companies/startech.html, 9 pages.
"Classification of Cast Iron"—Key to Steel—Article—http://www.key-to-steel.com/Articles/Art63.htm, 3 pages (1999).
Collin, in: *Foundations for Microwave Engineering*, 2d Ed., IEEE Press, NY, pp. 180-192 (2001).
"Controlled Atmospheres Sinter-Hardening,," Sarnes Ingenieure, 2 pages, http://www.space-ctrl.de/de/2002/06/399.php (2002).
Egashira et al., "Decomposition of Trichlorethylene by Microwave-Induced Plasma Generated from SiC Whiskers," *J. Electrochem. Soc.*, 145(1):229-235 (Jan. 1998).
Ford 1.3L Catalytic Converter (1988-1989) product description—http://catalyticconverters.com/FO13L43778889.html, 1 page, Undated.
Ford Contour Catalytic Converter (1995-1996) product description—http://www.all-catalytic-converters.com/ford-contour-converter.html, 2 pages, Undated.
French, "The Plasma Waste Converter—From Waste Disposal to Energy Creation," The International Chemical Weapons Demilitarization Conference, Gifu City, Japan (May 22-24, 2001)—http://www.arofe.army.mil/Conferences/CWC2001/French.htm, 1 page.
Gao et al., "Superfast Densification of Oxide/Oxide Ceramic Composites," *J. Am. Ceram. Soc.* 82(4)1061-1063 (1999).
Gedevanishvili et al., "Microwave Combustion Synthesis And Sintering of Intermetallics and Alloys," *J. Mat. Sci. Lett.* 18(9):665-668 (1999).
General Eastern, "Semiconductor Manufacturing—Using the HygroTwin 2850 to Reduce Costs, Improve Quality," , 3 pages, www.generaleastern.net (1997).
George, "The Catalytic Converter," 5 pages, (2002)—http://krioma.net/articles/Catalytic%20Converter/Catalytic%20Converter.htm.
GlassTesseract.Org website, "Tech Procedures and Tips: Exhaust Manifolds and Catalytic Converters Removal—and Installation", 4 pages (2003). http://glasstesseract.org/tech/catalytic.htm.
*Hackh's Chemical Dictionary*, 3rd edition, J. Grant, Ed., McGraw Hill Book Co., NY, pp. 174-175 (1944).
"Heat Treatment of Steels—The Processes," AZoM.com, 9 pages, (2002)—www.azom.com.
"Powder Metallurgy—Overview of the Powder Metallurgy Process," AZoM.com, 3 pages (2002)—http://www.azom.com/details.asp?ArticleID=1414.
Honda Civic CX Catalytic Converter, (1996-2000) 1 page—http://www.catalyticconverters.com/HOCIVICCX4349600.html, Undated.

"How A Blast Furnace Works—The Blast Furnace Plant," AISI Learning Center, 7 pages. http://www.steel.org/learning/howmade/blast_furnace.htm, Undated.

"How Is Steel Made," Answer Discussion, 6 pages—http://ourworld.compuserve.com/homepages/Dyaros/stlmanuf.htm, Undated.

Fincke, "Hydrogen Separation Membrane,—Advanced Gas Separation: H2 Separation," Summary of research proposal, 1 page (2003).

"IRC in Materials Processing: Advanced Melting, Atomisation, Powder and Spray Forming, Plasma Melting—Operation of a Plasma Furnace," University of Birmingham website, 3 pages—http://www.irc.bham.ac.uk/theme1/plasma/furnace.htm, Undated.

Saville, in: *Iron and Steel*, Chapter 6, pp. 16-22, Wayland Publ., England (1976).

Japanese Advanced Environment Equipment, "Mitsubishi Graphite Electrode Type Plasma Furnace," 3 pages, Undated—http://nett21.unep.or.jp/JSIM_DATA/WASTE/WASTE_3/html/Doc_467.html.

Johnson, Faculty Biography webpage, Dept. of Materials Science & Engineering, Northwestern University, 2 pages—http://www.matsci.northerwestern.edu/faculty/ dlj.html, Undated.

Karger, Scientific Staff Research Areas for KTP Company, 2 pages (Nov. 2002)—http://wwwfb10.upb.de/KTP/KTP-ENG/Staff/Karger/body_karger.html.

Lewis, in: *Hawley's Condensed Chemical Dictionary*, 12th ed., pp. 230-232, Van Nostrand Reinhold, NY (1993).

Lucas, "Welding Using Microwave Power Supplies," Faculty webpage, 1 page—http://www.liv.ac.uk/EEE/research/cer/project6.htm, Undated.

Luggenholscher et al., "Investigations on Electric Field Distributions in a Microwave Discharge in Hydrogen," Institute fur Laser- und Plasmaphysik, Univsitat Essen, Germany, 4 pages, Undated.

March Plasma Systems, product descriptions,2 pages (2002)—http://www.marchplasma.com/micro_app.htm, Undated.

"Micro-fabricated Palladium-Silver Membrane for Hydrogen Separation and Hydro/Dehydrogenation Reactions" Research Education Group webpage, 5 pages—http://utep.el.utwente.nl/tt/projects/sepmem/—Undated.

Ahmed et al., "Microwave Joining of Alumina and Zirconia Ceramics," IRIS Research Topics 1998, 1 page (1988).

"Microwave Welding," EWi WeldNet, 1 page—(2003) http://www.ferris.edu/cot/accounts/plastics/htdocs/Prey/Microwave%20Homepage.htm.

"Microwave Welding of Plastics," TWI World Centre for Materials Joining Technology, 2 pages (Aug. 2000)—http://www.twi.co.uk/j32k/protected/band_3/ksa001.htm.

"Microwave Welding," Welding and Joining Information Network, 3 pages (Nov. 2002)—http://www.ewi.org/technologies/plastics/mircowave.asp.

Moss et al., "Experimental Investigation of Hydrogen Transport Through Metals," Experimental Description, Los Alamos National Library, 5 pages—Undated. http://www.education.lanl.gov/RESOURCES/h2/dye/education.html.

"Nitriding," Treat All Metals, Inc., 2 pages—Undated—http://www.treatallmetals.com/nitrid.htm.

Thomas et al., "Non-Thermal Plasma Aftertreatment of Particulates—Theoretical Limits and Impact on Reactor Design," SAE Springs Fuels and Lubes Conference, Paris, France, 27 pages—Jun. 19-22, 2000—http://www.aeat.co.uk/electrocat/sae/saepaper.htm.

"Using Non-Thermal Plasma Reactor to Reduce NOx Emissions from CIDI Engines," Office of Energy Efficiency and Renewable Energy, Office of Transportation, 1 page (Apr. 1999).

"Optoelectronic Packaging Applications," March Plasma Systems, Product Description, 2 pages (2002)—http://www.marchplasma.com/opto_app.htm.

Paglieri et al., "Palladium Alloy Composite Membranes for Hydrogen Separation," 15th Annual Conf. Fossil Energy Matter, Knoxville, TN (2001), 5 pages.

PerfectH2 PE8000 Series Product Description, Palladium Diffusion Hydrogen Purifier For High Flow Rate MOCVD Applications, Matheson Tri.Gas, 2 pages (2002).

Photonics Directory, Definition for Thyratron, (Laurin Publishing), 2 pages http://www.photonics.com/dictionary/.

Pingel, "About What Every P/A Should Know About P/M," Powder Metallurgy Co., 9 pages—http://www.powdermetallurgyco.com/pm_about.htm.

"Plasma Applications," Coalition for Plasma Science, 2 pages (1999, 2000)—http://www.plasmacoalition.org/applications.htm.

"Plasma Carburizing," 1 page—Undated, http://www.ndkinc.co.jp/ndke04.html.

"Plasma Direct Melting Furnace," Materials Magic, Hitachi Metals Ltd., 3 pages—Undated, http://www.hitachi-metals.co.jp/e/prod/prod07/p07_2_02.html.

"Classical Plasma Applications," 2 pages (2002)—http://www.plasma.iinpe.br/English/Classical_Applications.htm.

"Plasma Nitride Process Description," Northeast Coating Technologies, 2 pages, Undated, www.northeastcoating.com.

Plasma Science and Technology, "Plasmas for Home, Business and Transportation," 4 pages—Undated. http://www.plasmas.org/rot-home.htm.

"Novel Plasma Catalysts Significantly Reduce NOx from Diesel Engines," US Department of Energy research summary, 2 pages (Apr. 20001)—http://www.ott.doe.gov/success.html.

"Printed Circuit Board (PCB) Plasma Applications," March Plasma Systems product descriptions, 2 pages (2002)—http://www.marchplasma.com/pcb_app.01.htm.

Roy et al., "Definitive Experimental Evidence for Microwave Effects: Radically New Effects of Separated E and H Fields, Such As Decrystallization of Oxides in Seconds," *Materials Research Innovations* 6(3):129-140 (2002).

Roy et al., "Full Sintering of Powdered-Metal Bodies In A Microwave Field," *Nature* 399:668-670 (Jun. 17, 1999).

Roy et al., "Major phase transformations and magnetic property changes caused by electromagnetic fields at microwave frequencies," *J. Mat. Res*. 17(12):3008-3011 (2002).

Roy et al., "Microwave Processing: Triumph of Applications-Driven Science in WC-Composites And Ferroic Titanates," *Ceramic Transactions* 80:3-26, (1997).

Rusanov, Introduction to the Hydrogen Energy & Plasma Technologies Institute: Russian Research Centre Kurchatov Institute, 13 pages, Undated—http://www.kiae.ru/eng/str/ihept/oiivept.htm.

Samant et al., "Glow Discharge Plasma Nitriding of Al 6063 Samples and Study of Their Surface Hardness," *Metallofiz. Noveishe Tekhnol*. 23(3):325-333 (2001).

Sato et al., "Surface Modification of Pure Iron by rf Plasma Nitriding with dc Bias Voltage Impression," *Hyomen Gijutsu* 48(3):317-323 (1997) (English Abstract).

Saveliev et al., "Effect of Cathode End Caps and a Cathode Emissive Surface on Relativistic Magnetron Operation," *IEEE Transactions on Plasma Science* 28:3.478-484 (Jun. 2000).

SC/Tetra Engine Manifold Application, 2 pages (2001)—http://www.sctetra.com/applications/01_manifold.htm.

Shulman, "Microwaves In High-Temperature Processes," GrafTech Intl. Ltd., 8 pages (Mar. 2003) http://www.industrialheating.com/CDA/ArticleInformation/features/BNP_Features_Item/0.2832.94035.00.html.

Slone et al., "NOx Reduction For Lean Exhaust Using Plasma Assisted Catalysis," NOXTECH INC., 5 pages (2000)—http://www.osti.gov/fevt/deer2000/bhattpa.pdf.

Stockwell Rubber Company, Inc., "Conductive Silicone Rubber Compounds Product Selection Guide," Electrically Conductive Materials Chart, 3 pages, Undated—http://www.stockwell.com/electrically_conductive_product.htm.

Sumitomo Heavy Industries, Ltd., "Spark Plasma Sintering," 3 pages (2001)—http://www.shi.co.jp/sps/eng/.

"Surface Hardening" Services Description for AHS Corp., 5 pages, Undated—http://www.ahscorp.com/surfaceh.html.

Takizawa et al. "Synthesis of inorganic materials by 28 GHz Microwave Irradiation," *Transactions of the Materials Research Society of Japan* 27(1):51-54 (2002).

"TestMAS: Pressure Sintering," 11 pages, Undated—http://cybercut.berkley.edu/mas2/processes/sinter_pressure.

Wolf et al., "The Amazing Metal Sponge: Simulations of Palladium-Hydride," 2 pages, Undated—http://www.psc.edu/science/Wolf/Wolf.html.

Toyota Motor Sales, "Emission Sub Systems—Catalytic Converter," 10 pages, Undated.

Uchikawa et al., "New Technique of Activating Palladium Surface for Absorption of Hydrogen or Deuterium," *Japanese J. Appl. Phys.* 32:5095-5096, Part 1, No. 11A (Nov. 1993).

Wang et al., "Densification of $Al_2O_3$ Powder Using Spark Plasma Sintering," *J. Mater. Res.*, 15(4):982-987 (Apr. 2000).

Way et al., "Palladium/Copper Alloy Composite Membranes for High Temperature Hydrogen Separation from Coal-Derived Gas Streams," Research Grant Report, Dept. of Chemical Engineering, Colorado School of Mines, 3 pages (1999).

Lucas, "Welding Breakthrough: Generating and Handling a Microwave Powered Plasma," Australian Industry News, Information & Suppliers, 7 pages (Sep. 2001)—http://www.industry/search.com.au/features/microwave.asp.

"Welding Plastic Parts," Business New Publishing Company, 4 pages (Nov. 2000)—http://www.assemblymag.com/Common/print_article.asp?rID=E455512C17534C31B96D.

Xie et al., "Effect of Rare Earths in Steels on the Thermochemical Treatments and the Functional Mechanisms of the Rare Earths," *Rare Metals Materials and Engineering* 26(1):52-55 (Feb. 1997) (English Abstract).

International Search Report issued on Jul. 23, 2003, in PCT/US03/14037.

International Search Report issued on Aug. 15, 2003, in PCT/US03/14124.

International Search Report issued on Sep. 10, 2003, in PCT/US03/14132.

International Search Report issued on Aug. 14, 2003, in PCT/US03/14052.

International Search Report issued on Aug. 14, 2003, in PCT/US03/14054.

International Search Report issued on May 10, 2004, in PCT/US03/14036.

International Search Report issued on Aug. 9, 2003, in PCT/US03/14053.

International Search Report issued on Feb. 25, 2004, in PCT/US03/14034.

International Search Report issued on Sep. 19, 2003, in PCT/US03/14039.

International Search Report issued on Aug. 29, 2003, in PCT/US03/14038.

International Search Report issued on Dec. 30, 2003, in PCT/US03/14133.

International Search Report issued on Aug. 28, 2003, in PCT/US03/14035.

International Search Report issued on Jul. 29, 2003, in PCT/US03/14040.

International Search Report issued on Sep. 10, 2003, in PCT/US03/14134.

International Search Report issued on Aug. 29, 2003, in PCT/US03/14122.

International Search Report issued on Sep. 30, 2003, in PCT/US03/14130.

International Search Report issued on May 24, 2004, in PCT/US03/14055.

International Search Report issued on May 26, 2004, in PCT/US03/14137.

International Search Report issued on Aug. 29, 2003, in PCT/US03/14123.

International Search Report issued on Aug. 29, 2003, in PCT/US03/14121.

International Search Report issued on Sep. 16, 2003, in PCT/US03/14136.

International Search Report issued on May 25, 2004, in PCT/US03/14135.

* cited by examiner

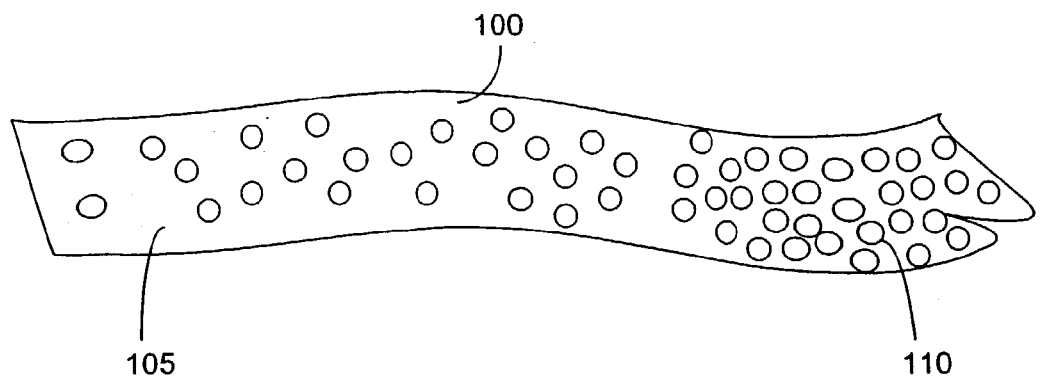
FIG. 3
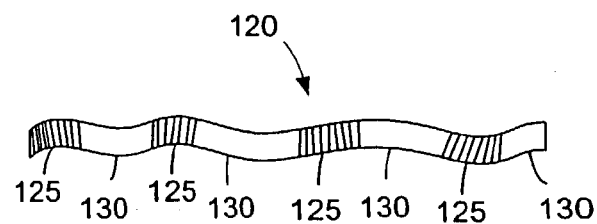
FIG. 4
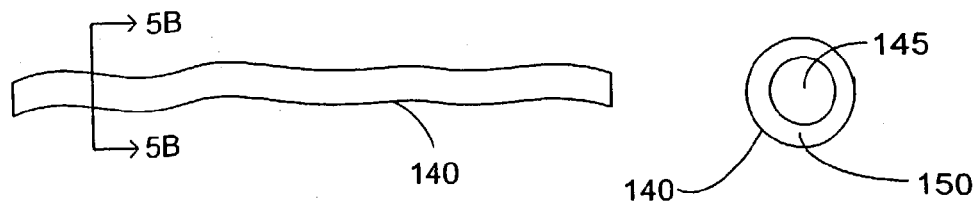
FIG. 5A
FIG. 5B

PLASMA GENERATION AND PROCESSING WITH MULTIPLE RADIATION SOURCES

CROSS-REFERENCE TO RELATED APPLICATIONS

Priority is claimed to U.S. Provisional Patent Application No. 60/378,693, filed May 8, 2002, No. 60/430,677, filed Dec. 4, 2002, and No. 60/435,278, filed Dec. 23, 2002, all of which are fully incorporated herein reference.

FIELD OF THE INVENTION

The invention relates to methods and apparatus for plasma-assisted processing, and in particular to using multiple electromagnetic radiation sources in combination.

BACKGROUND OF THE INVENTION

It is known that a single microwave radiation source can be used to generate a plasma by subjecting a gas to a sufficient amount of microwave radiation. A single microwave energy source can be damaged, however, when one source directs microwave energy into a plasma chamber that reflects the energy back toward the same source. This can be especially problematic when there is no strong microwave absorber in the cavity, such as when a plasma is not yet formed. Also, multiple microwave energy sources are particularly susceptible to damage when combined to ignite or sustain a plasma. For example, a first source can be damaged when it directs microwave energy into a chamber because that energy could be directed into another simultaneously connected radiation source.

It is also known that plasma ignition is usually easier at gas pressures substantially less than atmospheric pressure. However, vacuum equipment, which is required to lower the gas pressure, can be expensive, as well as slow and energy-consuming. Moreover, the use of such equipment can limit manufacturing flexibility.

BRIEF SUMMARY OF A FEW ASPECTS OF THE INVENTION

Consistent with the present invention, apparatus and methods using multiple radiation sources (e.g., microwave radiation sources) are provided. Plasmas formed from gases at pressures at about one atmosphere or higher can strongly absorb microwave radiation. Strong absorption can be used to reduce the possibility of damage to a particular source by its own radiation that may be reflected back or radiation from other sources. Consequently, high power plasma-assisted processes can be carried out using multiple (e.g., low power) sources coupled to the same plasma.

In one embodiment, a radiation apparatus may include a cavity. The radiation apparatus can also include a first high-frequency radiation source and a second high-frequency radiation source for directing radiation into the cavity. The radiation apparatus may include a controller for sequentially activating the second radiation source after the first radiation source is activated.

In another embodiment consistent with this invention, a plasma furnace may include a chamber, a conduit for supplying gas to the chamber, a plurality of radiation sources arranged to radiate radiation into the chamber, and a controller for delaying activation of all but a first of the plurality of radiation sources until after the first radiation source is activated. A radiation apparatus and a plasma furnace consistent with this invention may include a plasma catalyst located proximate to the cavity. The plasma catalyst can cooperate with the microwave radiation in the presence of a gas to form a plasma. The catalyst can be passive or active. A passive plasma catalyst can include any object capable of inducing a plasma by deforming a local electric field (e.g., an electromagnetic field) consistent with this invention, without necessarily adding additional energy. An active plasma catalyst, on the other hand, is any particle or high energy wave packet capable of transferring a sufficient amount of energy to a gaseous atom or molecule to remove at least one electron from the gaseous atom or molecule in the presence of electromagnetic radiation. In both cases, a plasma catalyst can improve, or relax, the environmental conditions required to ignite a plasma.

In another embodiment consistent with this invention, a method for forming a plasma is provided. The method can include employing at least first and second radiation sources arranged to direct radiation into a processing or heating region. The method can include introducing gas into the region, activating the first radiation source to facilitate formation of plasma in the heating region, and activating the second radiation source after the plasma is formed.

In yet another embodiment consistent with this invention, additional methods and apparatus are provided for forming a plasma using a dual-cavity system. The system can include a first ignition cavity and a second cavity in fluid communication with each other. The method can include (i) subjecting a gas in the first ignition cavity to electromagnetic radiation having a frequency less than about 333 GHz, such that the plasma in the first cavity causes a second plasma to form in the second cavity, and (ii) sustaining the second plasma in the second cavity by subjecting it to additional electromagnetic radiation.

Additional plasma catalysts, and methods and apparatus for igniting, modulating, and sustaining a plasma consistent with this invention are provided.

BRIEF DESCRIPTION OF THE DRAWINGS

Further aspects of the invention will be apparent upon consideration of the following detailed description, taken in conjunction with the accompanying drawings, in which like reference characters refer to like parts throughout, and in which:

FIG. 3 shows an illustrative plasma catalyst fiber with at least one component having a concentration gradient along its length consistent with this invention;

FIG. 4 shows an illustrative plasma catalyst fiber with multiple components at a ratio that varies along its length consistent with this invention;

FIG. 5A shows another illustrative plasma catalyst fiber that includes a core underlayer and a coating consistent with this invention;

FIG. 5B shows a cross-sectional view of the plasma catalyst fiber of FIG. 5A, taken from line 5B—5B of FIG. 5A, consistent with this invention;

DETAILED DESCRIPTION OF THE EMBODIMENTS

Figure 1A:
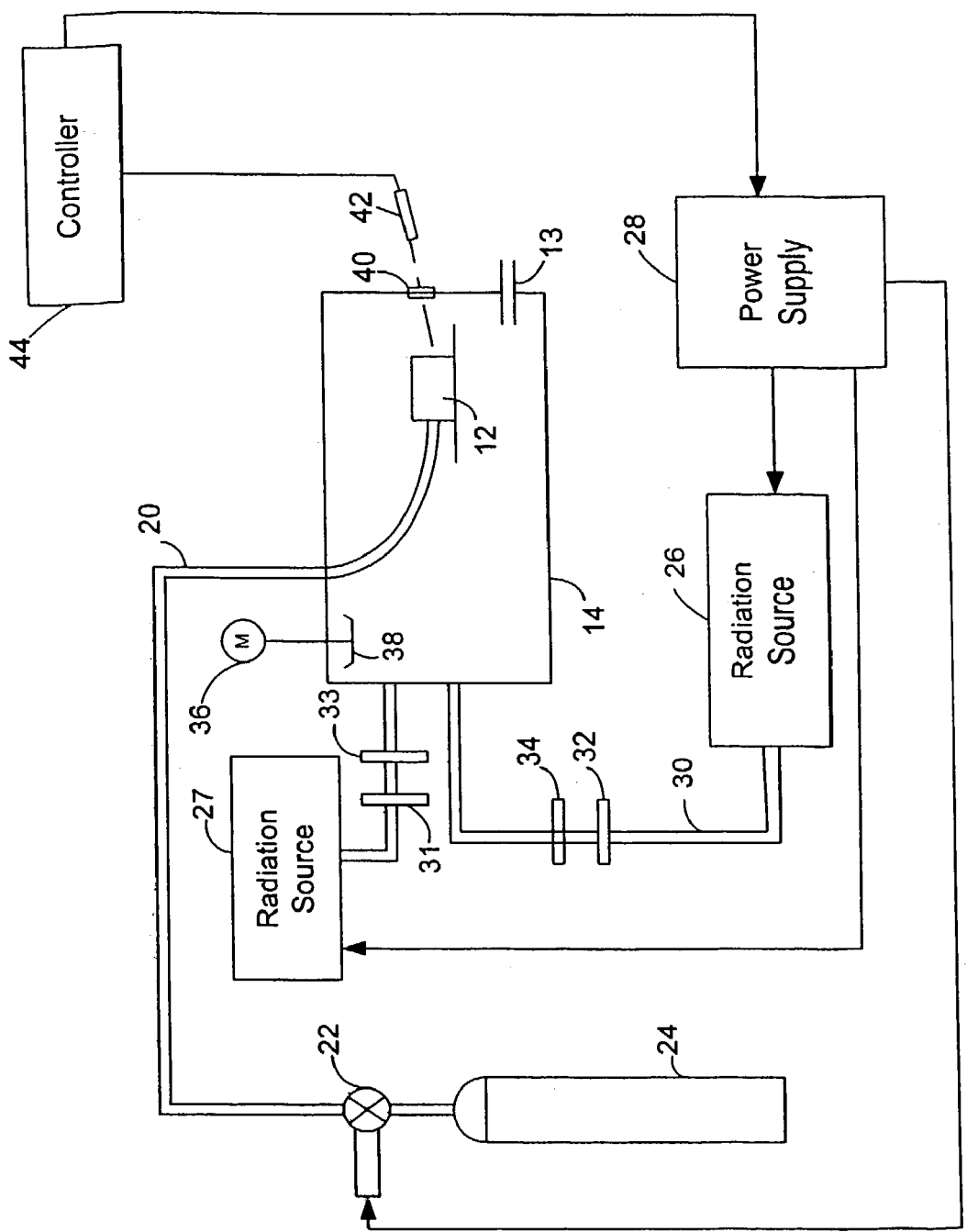
FIG. 1A shows a schematic diagram of an illustrative apparatus that includes multiple radiation sources consistent with this invention.

Consistent with the present invention, plasma apparatus and methods that use multiple radiation sources are provided. In one embodiment, as shown in FIG. 1A, a radiation apparatus may include cavity 12. Further, in one embodiment, the radiation apparatus may further include a plasma catalyst located proximate to the cavity, which may cooperate with the radiation to cause the gas to form a plasma.

This invention may further relate to methods and apparatus for initiating, modulating, and sustaining a plasma for a variety of applications, including heat-treating, synthesizing and depositing carbides, nitrides, borides, oxides, and other materials, doping, carburizing, nitriding, and carbonitriding, sintering, multi-part processing, joining, sintering, decrystallizing, making and operating furnaces, gas exhaust-treating, waste-treating, incinerating, scrubbing, ashing, growing carbon structures, generating hydrogen and other gases, forming electrodeless plasma jets, plasma processing in assembly lines, sterilizing, etc.

In another embodiment, a plasma furnace is provided that may include a chamber, a conduit for supplying gas to the chamber, a plurality of radiation sources arranged to radiate radiation into the chamber and a controller for delaying activation of all but a first of the plurality of radiation sources until after the first radiation source is activated. Each of these components is explained more fully below.

This invention can be used for controllably generating heat and for plasma-assisted processing to lower energy costs and increase heat-treatment efficiency and plasma-assisted manufacturing flexibility.

Therefore, a plasma catalyst for initiating, modulating, and sustaining a plasma is provided. The catalyst can be passive or active. A passive plasma catalyst can include any object capable of inducing a plasma by deforming a local electric field (e.g., an electromagnetic field) consistent with this invention without necessarily adding additional energy through the catalyst, such as by applying a voltage to create a spark. An active plasma catalyst, on the other hand, may be any particle or high energy wave packet capable of transferring a sufficient amount of energy to a gaseous atom or ion to remove at least one electron from the gaseous atom or molecule, in the presence of electromagnetic radiation.

The following commonly owned, concurrently filed U.S. patent applications are hereby incorporated by reference in their entireties: U.S. patent application Ser. No. 10/513,221 (filed from PCT Application No. PCT/US03/14037), U.S. application Ser. No. 10/513,393 (filed from PCT Application No. PCT/US03/14124), PCT Application No. PCT/US03/14132, U.S. application Ser. No. 10/513,394 (filed from PCT Application No. PCT/US03/14052), U.S. application Ser. No. 10/513,607 (filed from PCT Application No. PCT/US03/14036), U.S. application Ser. No. 10/449,600 (PCT Application No. PCT/US03/14133), U.S. application Ser. No. 10/430,414 (PCT Application No. PCT/US03/14053), PCT Application No. PCT/US03/14034, U.S. application Ser. No. 10/430,416 (PCT Application No. PCT/US03/14039), U.S. application Ser. No. 10/430,415 (PCT Application No. PCT/US03/14038), PCT Application No. PCT/US03/14133, U.S. application Ser. No. 10/513,606 (filed from PCT Application No. PCT/US03/14035), U.S. application Ser. No. 10/513,309 (filed from PCT Application No. PCT/US03/14040), U.S. application Ser. No. 10,413,220 (filed from PCT Application No. PCT/US03/14134), PCT Application No. PCT/US03/14122, U.S. application Ser. No. 10/513,397 (filed from PCT Application No. PCT/US03/14130), U.S. application Ser. No. 10/513,605 (filed from PCT Application No. PCT/US03/14055), PCT Application No. PCT/US03/14137, U.S. application Ser. No. 10/430,426 (PCT Application No. PCT/US03/14123), PCT Application No. PCT/US03/14121, U.S. Application No. 10/513,604 (filed from PCT Application No. PCT/US03/14136), and PCT Application NO. PCT/US03/14135.

Illustrative Plasma System

FIG. 1A shows a schematic diagram of an illustrative radiation apparatus consistent with one aspect of the invention. The exemplary radiation apparatus may include cavity 12 formed in a vessel that may be positioned inside a microwave chamber (also known as applicator) 14. In another embodiment (not shown), vessel 12 and microwave chamber 14 are the same, thereby eliminating the need for two separate components. The vessel in which cavity 12 is formed can include one or more radiation-transmissive insulating layers to improve its thermal insulation properties without significantly shielding cavity 12 from the radiation.

In one embodiment, the radiation apparatus may be configured as a plasma furnace. One skilled in the art will appreciate that the radiation apparatus may also be used for initiating, modulating, and sustaining a plasma for a variety of other applications, including, for example, heat-treating, synthesizing and depositing carbides, nitrides, borides, oxides, and other materials, doping, carburizing, nitriding, and carbonitriding, sintering, multi-part processing, joining, sintering, decrystallizing, making and operating furnaces, gas exhaust-treating, waste-treating, incinerating, scrubbing, ashing, growing carbon structures, generating hydrogen and other gases, forming electrodeless plasma jets, plasma processing in assembly lines, sterilizing, etc.

In one embodiment, cavity 12 is formed in a vessel made of ceramic. Due to the extremely high temperatures that can be achieved with plasmas consistent with this invention, a ceramic capable of operating at about 3,000 degrees Fahrenheit can be used. The ceramic material can include, by weight, 29.8% silica, 68.2% alumina, 0.4% ferric oxide, 1% titania, 0.1% lime, 0.1% magnesia, 0.4% alkalies, which is sold under Model No. LW-30 by New Castle Refractories Company, of New Castle, Pa. It will be appreciated by those of ordinary skill in the art, however, that other materials, such as quartz, and those different from the one described above, can also be used consistent with the invention.

A plasma may be formed in a partially open cavity inside a first brick and topped with a second brick. The cavity may have dimensions of about 2 inches by about 2 inches by about 1.5 inches. At least two holes may also be provided in the brick in communication with the cavity: one for viewing the plasma and at least one hole for providing the gas. The size of the cavity can depend on the desired plasma process being performed. Also, the cavity should at least be configured to prevent the plasma from rising/floating away from the primary processing region.

Cavity 12 can be connected to one or more gas sources 24 (e.g., a source of argon, nitrogen, hydrogen, xenon, krypton) by line 20 and control valve 22, which may be powered by power supply 28. Line 20 may be tubing (e.g., between about 1/16 inch and about 1/4 inch, such as about 1/8"). Also, if desired, a vacuum pump can be connected to the chamber to remove any acidic fumes that may be generated during plasma processing. Also, any excess gas may escape the chamber via gas port 13 or similar additional gas ports.

A radiation leak detector (not shown) may be installed near source 26 and waveguide 30 and connected to a safety interlock system to automatically turn off the radiation (e.g., microwave) power supply if a leak above a predefined safety limit, such as one specified by the FCC and/or (e.g., 5 $mW/cm^2$), was detected.

In one embodiment, the radiation apparatus may include radiation source 26 for directing radiation into the cavity. The radiation apparatus may further include radiation source 27 for directing radiation into the cavity. Although FIG. 1A depicts two radiation sources, it will be appreciated that the radiation apparatus can operate with two or more sources.

In one embodiment, source 26 may be configured to generate radiation that is cross-polarized relative to microwave radiation generated by source 27 and/or any other additional sources.

Each of radiation sources 26 and 27 may be a magnetron, a klystron, a gyrotron, a traveling-wave tube amplifier/oscillator or any other device capable of generating radiation, such as microwave radiation. Also, the frequency of the radiation is believed to be non-critical in many applications. Thus, for example, radiation having any frequency less than about 333 GHz can be used consistent with this invention. For example, frequencies, such as power line frequencies (about 50 Hz to about 60 Hz), can be used, although the pressure of the gas from which the plasma is formed may be lowered to assist with plasma ignition. Also, any radio frequency or microwave frequency can be used consistent with this invention, including frequencies greater than about 100 kHz. In most cases, the gas pressure for such relatively high frequencies need not be lowered to ignite, modulate, or sustain a plasma, thereby enabling many plasma-processes to occur over a broad range of pressures, including atmospheric pressure and above.

Radiation source 26, which may be powered by electrical power supply 28, directs radiation energy into chamber 14 through one or more waveguides 30. It will be appreciated by those of ordinary skill in the art that source 26 can be connected directly to cavity 12 or chamber 14, thereby eliminating waveguide 30. The radiation energy entering cavity 12 is used to ignite a plasma within the cavity. This plasma can be substantially sustained and confined to the cavity by coupling additional radiation with the catalyst. Other radiation sources (such as 27) may similarly be directly connected to cavity 12 or chamber 14 or through one or more waveguides. Additionally, each one of them may be powered by power supply 28 or any other combination of power supplies may be used.

Radiation energy, from radiation source 26, can be supplied through circulator 32 and tuner 34 (e.g., 3-stub tuner). Tuner 34 can be used to minimize the reflected power as a function of changing ignition or processing conditions, especially after the plasma has formed because microwave power, for example, will be strongly absorbed by the plasma. Similarly, radiation energy from radiation source 27 may be supplied through circulator 31 and tuner 33, although the use of circulators and tuners are optional.

In one embodiment, each of the radiation sources may be protectively separated from the chamber by an isolator (not shown). An isolator permits radiation to pass in one direction only, thereby protecting a source not only from reflected radiation, but also from radiation from other sources. However, consistent with this invention, reflected radiation can be minimized, especially during the early stages of plasma ignition.

Detector 42 can develop output signals as a function of the temperature or any other monitorable condition associated with a work piece (not shown) within cavity 12 and provide the signals to controller 44. Dual temperature sensing and heating, as well as automated cooling and gas flow controls can also be used. Also, controller 44 may be programmed to sequentially activate source 27 after source 26 is activated. In another embodiment, controller 44 may delay activation of source 27 for a predetermined period following the activation of source 26. Sources 26 and 27 may also be delayed in a similar manner and may be triggered by any measurable event, if desired.

In one embodiment, detector 42 may provide an indication of microwave radiation absorption, and controller 44 may delay activation of one or more of the plurality of microwave radiation sources until after controller 44 receives a signal from detector 42 that a predetermined absorption threshold level has been reached.

Detector 42 may be any device that detects one or more of heat, radiation absorption, radiation reflectance, radiation transmission, the existence of plasma, or any other phenomena signaling whether plasma formation has or has not occurred. Examples of such detectors include heat sensors, pyrometers, or any other sensor capable of detecting heat, temperature, radiation absorption, radiation reflectance, radiation transmission, the existence of plasma, or any other radiation related phenomena.

Detector 42 can develop output signals as a function of the temperature or any other monitorable condition associated with a work piece (not shown) within cavity 12 and provide the signals to controller 44. Dual temperature sensing and heating, as well as automated cooling rate and gas flow controls can also be used. Controller 44 in turn can be used to control operation of power supply 28, which can have one output connected to source 26 as described above and another output connected to valve 22 to control gas flow into cavity 12. Although not shown, controller 44 or other similar controllers may be used to control operation of any other power supplies that may be used to supply power to the other radiation sources.

In another embodiment, detector 42 may provide an indication of radiation absorption by, for example, an object that is being processed. In this case, controller 44 may delay activation of subsequent sources until after controller 44 receives a signal from detector 42 that a predetermined absorption level has been reached.

Controller 44 may also be configured to delay activation of at least one of the plurality of radiation sources for a predetermined period following activation of the first radiation source. Then, each of the remaining plurality of radiation sources may be successively activated at predetermined intervals, if desired. Controller 44 may also be configured to activate one or more additional radiation sources only after at least one of the first and second radiation sources is activated. Also, controller 44 may be configured to activate each of the plurality of additional radiation sources only after each of the first and the second radiation sources is activated.

Consistent with this invention, a plasma apparatus may include a plasma catalyst that is located proximate to a plasma cavity. The catalyst can cooperate with the radiation to cause a gas to form a plasma. Also, as used herein, the phrase "proximate the cavity" means either within the cavity or at a location sufficiently close to the cavity to effect the formation of the plasma.

As explained more fully below, the location of radiation-transmissive cavity 12 in chamber 14 may not be critical if chamber 14 supports multiple modes, and especially when the modes are continually or periodically mixed. As also explained more fully below, motor 36 can be connected to mode-mixer 38 for making the time-averaged radiation energy distribution substantially uniform throughout chamber 14. Furthermore, window 40 (e.g., a quartz window) can be disposed in one wall of chamber 14 adjacent to cavity 12, permitting temperature detector 42 (e.g., an optical pyrometer) to be used to view a process inside cavity 12. In one embodiment, the optical pyrometer output can increase from zero volts as the temperature rises to within the tracking range.

The invention may be practiced, for example, by employing microwave sources at both 915 MHz and 2.45 GHz provided by Communications and Power Industries (CPI), although radiation having any frequency less than about 333 GHz can be used. The 2.45 GHz system may provide, for example, continuously variable microwave power from about 0.5 kilowatts to about 5.0 kilowatts. A 3-stub tuner may allow impedance matching for maximum power transfer and a dual directional coupler may be used to measure forward and reflected powers. Also, optical pyrometers may be used for remote sensing of the sample temperature.

As mentioned above, radiation having any frequency less than about 333 GHz can be used consistent with this invention. For example, frequencies, such as power line frequencies (about 50 Hz to about 60 Hz), can be used, although the pressure of the gas from which the plasma is formed may be lowered to assist with plasma ignition. Also, any radio frequency or microwave frequency can be used consistent with this invention, including frequencies greater than about 100 kHz. In most cases, the gas pressure for such relatively high frequencies need not be lowered to ignite, modulate, or sustain a plasma, thereby enabling many plasma-processes to occur at atmospheric pressures and above.

The equipment may be computer controlled using Lab View 6i software, which may provide real-time temperature monitoring and microwave power control. Noise may be reduced by using shift registers to generate sliding averages of suitable number of data points. Also, the number of stored data points in the array may be limited to improve speed and computational efficiency. The pyrometer may measure the temperature of a sensitive area of about 1 cm$^2$, which may be used to calculate an average temperature. The pyrometer may sense radiant intensities at two wavelengths and fit those intensities using Planck's law to determine the temperature. It will be appreciated, however, that other devices and methods for monitoring and controlling temperature are also available and can be used consistent with this invention. Control software that can be used consistent with this invention is described, for example, in commonly owned, concurrently filed PCT Application No. PCT/US03/14135, which is hereby incorporated by reference in its entirety.

Chamber 14 may have several glass-covered viewing ports with radiation shields and one quartz window for pyrometer access. Several ports for connection to a vacuum pump and a gas source may also be provided, although not necessarily used.

The exemplary radiation apparatus may also include a closed-loop deionized water cooling system (not shown) with an external heat exchanger cooled by tap water. During operation, the deionized water may first cool the magnetron, then the load-dump in the circulator (used to protect the magnetron), and finally the microwave chamber through water channels welded on the outer surface of the chamber.

Methods and Apparatus Using Multiple Radiation Sources

Figure 1B:
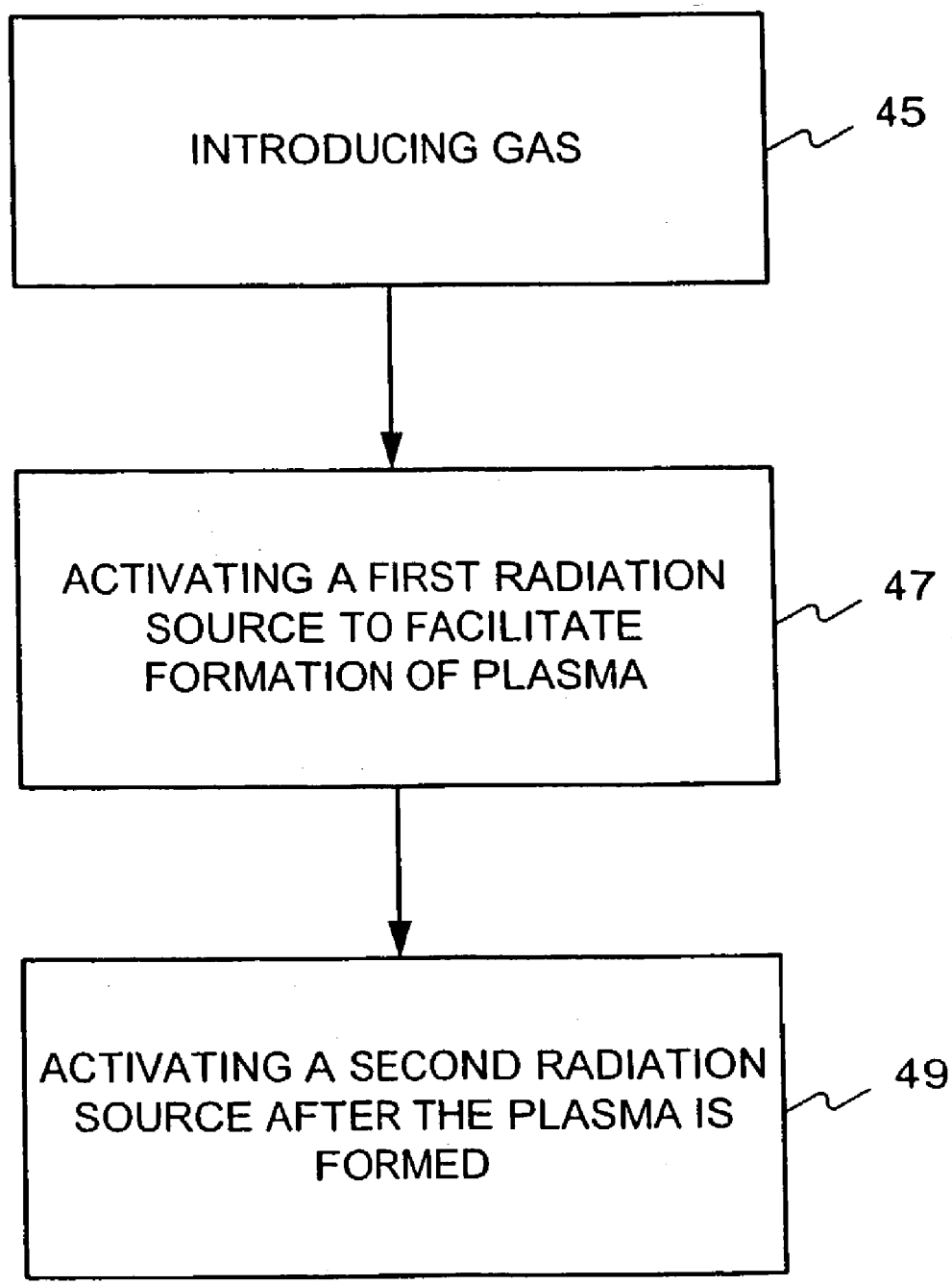
FIG. 1B shows a flow chart for an illustrative method consistent with this invention.

FIG. 1B shows a method employing at least a first and second radiation source, both arranged to direct radiation into a plasma formation region. The method may include introducing a gas (step 45) into a plasma-formation region. In one embodiment, this may be accomplished by turning on valve 22 of FIG. 1A. It will be appreciated by those of ordinary skill in the art that the plasma-formation region could be a cavity, which can be completely closed or partially open. For example, in certain applications, such as in plasma-assisted furnaces, the cavity could be entirely closed. See, for example, commonly owned, concurrently filed PCT Application No. PCT/US03/14133, which is fully incorporated herein by reference. In other applications, however, it may be desirable to flow a gas through the cavity, and therefore the cavity must be open to some degree. In this way, the flow, type, and pressure of the flowing gas can be varied over time. This may be desirable because certain gases with lower ionization potentials, such as argon, are easier to ignite but may have other undesirable properties during subsequent plasma processing.

The method may further include activating a first radiation source to facilitate formation of plasma in step 47. In one embodiment, plasma formation may be facilitated using some kind of a plasma catalyst, such as a pointed metal tip, a spark generator, carbon, fiberous material, powderous material or any other catalyst capable of facilitating plasma ignition. Additional examples of plasma catalysts and their uses consistent with the present invention are more fully described below.

The method may further include activating a second radiation source after the plasma is formed (step 49). In one embodiment, radiation source 27 may be activated after the first radiation source is activated. The method may further include activating at least one additional radiation source after at least one of the first and second sources is activated. Further, the activation of the at least one additional radiation source may be delayed until after both the first and second sources are activated.

The radiation sources may be, for example, a magnetron, a klystron, a gyrotron, a traveling-wave tube amplifier/oscillator, or any other source of radiation. Further, in one embodiment, the radiation sources may be cross-polarized.

Additionally, in one embodiment, the method may include activating a plurality of radiation sources, wherein each of the plurality of microwave sources is successively activated at predetermined intervals.

In another embodiment, the plasma region may contain a plasma catalyst. The plasma catalyst consistent with this invention can include one or more different materials and may be either passive or active. A plasma catalyst can be used, among other things, to ignite, modulate, and/or sustain a plasma at a gas pressure that is less than, equal to, or greater than atmospheric pressure.

Plasma Catalysts

One method of forming a plasma consistent with this invention can include subjecting a gas in a cavity to electromagnetic radiation having a frequency less than about 333 GHz in the presence of a passive plasma catalyst. A passive plasma catalyst consistent with this invention can include any object capable of inducing a plasma by deforming a local electric field (e.g., an electromagnetic field) consistent with this invention, without necessarily adding additional energy through the catalyst, such as by applying an electric voltage to create a spark.

A passive plasma catalyst consistent with this invention can also be a nano-particle or a nano-tube. As used herein, the term "nano-particle" can include any particle having a maximum physical dimension less than about 100 nm that is at least electrically semi-conductive. Also, both single-walled and multi-walled carbon nanotubes, doped and undoped, can be particularly effective for igniting plasmas consistent with this invention because of their exceptional electrical conductivity and elongated shape. The nanotubes can have any convenient length and can be a powder fixed to a substrate. If fixed, the nanotubes can be oriented randomly on the surface of the substrate or fixed to the substrate (e.g., at some predetermined orientation) while the plasma is ignited or sustained.

A passive plasma catalyst can also be a powder consistent with this invention, and need not comprise nano-particles or nano-tubes. It can be formed, for example, from fibers, dust particles, flakes, sheets, etc. When in powder form, the catalyst can be suspended, at least temporarily, in a gas. By suspending the powder in the gas, the powder can be quickly dispersed throughout the cavity and more easily consumed, if desired.

Figure 2:
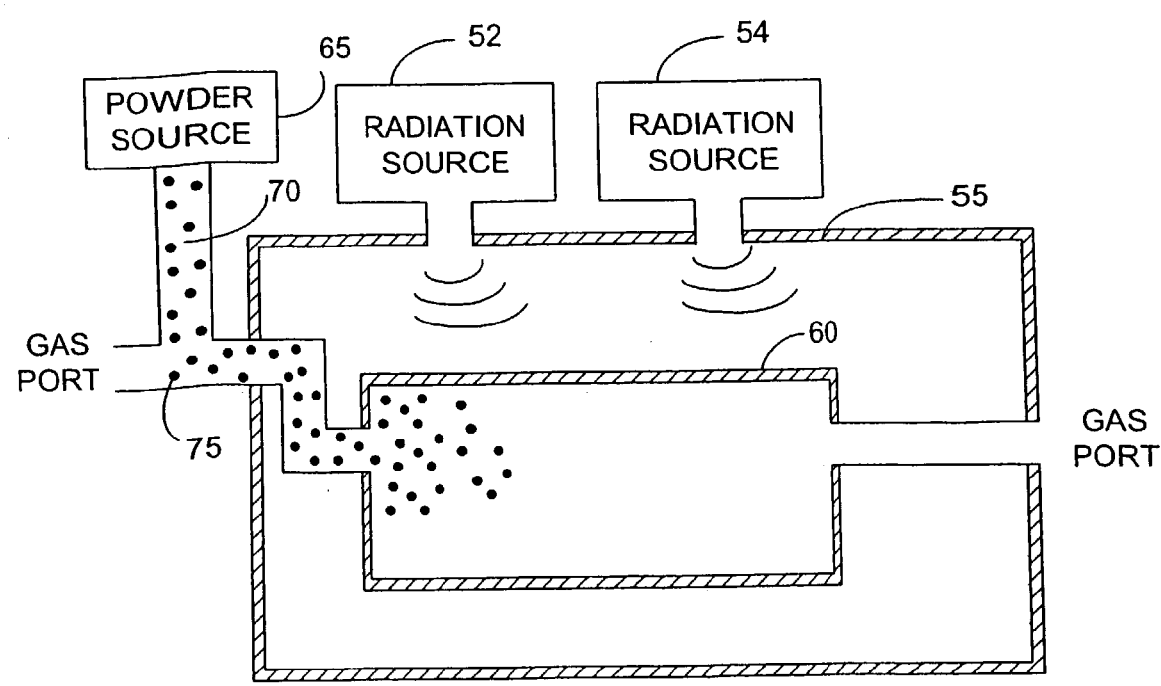
FIG. 2 shows a simplified illustrative embodiment of a portion of a plasma system for adding a powder plasma catalyst to a plasma cavity for igniting, modulating, or sustaining a plasma in a cavity consistent with this invention.

In one embodiment, the powder catalyst can be carried into the cavity and at least temporarily suspended with a carrier gas. The carrier gas can be the same or different from the gas that forms the plasma. Also, the powder can be added to the gas prior to being introduced to the cavity. For example, as shown in FIG. 2, radiation source 52 and radiation source 54 can supply radiation to radiation cavity 55, in which plasma cavity 60 is placed. Powder source 65 provides catalytic powder 70 into gas stream 75. In an alternative embodiment, powder 70 can be first added to cavity 60 in bulk (e.g., in a pile) and then distributed in the cavity in any number of ways, including flowing a gas through or over the bulk powder. In addition, the powder can be added to the gas for igniting, modulating, or sustaining a plasma by moving, conveying, drizzling, sprinkling, blowing, or otherwise, feeding the powder into or within the cavity. Although FIG. 2 shows only two radiation sources, additional radiation sources may be used. In one embodiment consistent with this invention, microwave source 54 may be activated and then, after a plasma is formed, microwave source 55 may be activated.

In one experiment, a plasma was ignited in a cavity by placing a pile of carbon fiber powder in a copper pipe that extended into the cavity. Although sufficient radiation was directed into the cavity, the copper pipe shielded the powder from the radiation and no plasma ignition took place. However, once a carrier gas began flowing through the pipe, forcing the powder out of the pipe and into the cavity, and thereby subjecting the powder to the radiation, a plasma was nearly instantaneously ignited in the cavity. This permits a subsequent radiation source to be activated, which reduces the ramp-up time required to achieve, for example, very high temperature plasmas.

A powder plasma catalyst consistent with this invention can be substantially non-combustible, thus it need not contain oxygen or burn in the presence of oxygen. Thus, as mentioned above, the catalyst can include a metal, carbon, a carbon-based alloy, a carbon-based composite, an electrically conductive polymer, a conductive silicone elastomer, a polymer nanocomposite, an organic-inorganic composite, and any combination thereof.

Also, powder catalysts can be substantially uniformly distributed in the plasma cavity (e.g., when suspended in a gas), and plasma ignition can be precisely controlled within the cavity. Uniform ignition can be important in certain applications, including those applications requiring brief plasma exposures, such as in the form of one or more bursts. Still, a certain amount of time can be required for a powder catalyst to distribute itself throughout a cavity, especially in complicated, multi-chamber cavities. Therefore, consistent with another aspect of this invention, a powder catalyst can be introduced into the cavity through a plurality of ignition ports to more rapidly obtain a more uniform catalyst distribution therein (see below).

In addition to powder, a passive plasma catalyst consistent with this invention can include, for example, one or more microscopic or macroscopic fibers, sheets, needles, threads, strands, filaments, yarns, twines, shavings, slivers, chips, woven fabrics, tape, whiskers, or any combination thereof. In these cases, the plasma catalyst can have at least one portion with one physical dimension substantially larger than another physical dimension. For example, the ratio between at least two orthogonal dimensions should be at least about 1:2, but could be greater than about 1:5, or even greater than about 1:10.

Thus, a passive plasma catalyst can include at least one portion of material that is relatively thin compared to its length. A bundle of catalysts (e.g., fibers) may also be used and can include, for example, a section of graphite tape. In one experiment, a section of tape having approximately thirty thousand strands of graphite fiber, each about 2–3 microns in diameter, was successfully used. The number of fibers in and the length of a bundle are not critical to igniting, modulating, or sustaining the plasma. For example, satisfactory results have been obtained using a section of graphite tape about one-quarter inch long. One type of carbon fiber that has been successfully used consistent with this invention is sold under the trademark Magnamite®, Model No. AS4C-GP3K, by the Hexcel Corporation, of Anderson, S.C. Also, silicon-carbide fibers have been successfully used.

A passive plasma catalyst consistent with another aspect of this invention can include one or more portions that are, for example, substantially spherical, annular, pyramidal, cubic, planar, cylindrical, rectangular or elongated.

The passive plasma catalysts discussed above include at least one material that is at least electrically semi-conductive. In one embodiment, the material can be highly conductive. For example, a passive plasma catalyst consistent with this invention can include a metal, an inorganic material, carbon, a carbon-based alloy, a carbon-based composite, an electrically conductive polymer, a conductive silicone elastomer, a polymer nanocomposite, an organic-inorganic composite, or any combination thereof. Some of the possible inorganic materials that can be included in the plasma catalyst include carbon, silicon carbide, molybdenum, platinum, tantalum, tungsten, carbon nitride, and aluminum, although other electrically conductive inorganic materials are believed to work just as well.

In addition to one or more electrically conductive materials, a passive plasma catalyst consistent with this invention can include one or more additives (which need not be electrically conductive). As used herein, the additive can include any material that a user wishes to add to the plasma. For example, in doping semiconductors and other materials, one or more dopants can be added to the plasma through the catalyst. See, e.g., commonly owned, concurrently filed U.S. patent application Ser. No, 10/513,397 (filed from PCT Application No. PCT/US03/14130), which is hereby incorporated by reference in its entirety. The catalyst can include the dopant itself, or it can include a precursor material that, upon decomposition, can form the dopant. Thus, the plasma catalyst can include one or more additives and one or more electrically conductive materials in any desirable ratio, depending on the ultimate desired composition of the plasma and the process using the plasma.

The ratio of the electrically conductive components to the additives in a passive plasma catalyst can vary over time while being consumed. For example, during ignition, the plasma catalyst could desirably include a relatively large percentage of electrically conductive components to improve the ignition conditions. On the other hand, if used while sustaining the plasma, the catalyst could include a relatively large percentage of additives. It will be appreciated by those of ordinary skill in the art that the component ratio of the plasma catalyst used to ignite and sustain the plasma could be the same.

A predetermined ratio profile can be used to simplify many plasma processes. In many conventional plasma processes, the components within the plasma are added as necessary, but such addition normally requires programmable equipment to add the components according to a predetermined schedule. However, consistent with this invention, the ratio of components in the catalyst can be varied, and thus the ratio of components in the plasma itself can be automatically varied. That is, the ratio of components in the plasma at any particular time can depend on which of the catalyst portions is currently being consumed by the plasma. Thus, the catalyst component ratio can be different at different locations within the catalyst. And, the current ratio of components in a plasma can depend on the portions of the catalyst currently and/or previously consumed, especially when the flow rate of a gas passing through the plasma chamber is relatively slow.

A passive plasma catalyst consistent with this invention can be homogeneous, inhomogeneous, or graded. Also, the plasma catalyst component ratio can vary continuously or discontinuously throughout the catalyst. For example, in FIG. 3, the ratio can vary smoothly forming a gradient along a length of catalyst 100. Catalyst 100 can include a strand of material that includes a relatively low concentration of a component at section 105 and a continuously increasing concentration toward section 110.

Alternatively, as shown in FIG. 4, the ratio can vary discontinuously in each portion of catalyst 120, which includes, for example, alternating sections 125 and 130 having different concentrations. It will be appreciated that catalyst 120 can have more than two section types. Thus, the catalytic component ratio being consumed by the plasma can vary in any predetermined fashion. In one embodiment, when the plasma is monitored and a particular additive is detected, further processing can be automatically commenced or terminated.

Another way to vary the ratio of components in a sustained plasma is by introducing multiple catalysts having different component ratios at different times or different rates. For example, multiple catalysts can be introduced at approximately the same location or at different locations within the cavity. When introduced at different locations, the plasma formed in the cavity can have a component concentration gradient determined by the locations of the various catalysts. Thus, an automated system can include a device by which a consumable plasma catalyst is mechanically inserted before and/or during plasma igniting, modulating, and/or sustaining.

A passive plasma catalyst consistent with this invention can also be coated. In one embodiment, a catalyst can include a substantially non-electrically conductive coating deposited on the surface of a substantially electrically conductive material. Alternatively, the catalyst can include a substantially electrically conductive coating deposited on the surface of a substantially electrically non-conductive material. FIGS. 5A and 5B, for example, show fiber 140, which includes underlayer 145 and coating 150. In one embodiment, a plasma catalyst including a carbon core is coated with nickel to prevent oxidation of the carbon.

A single plasma catalyst can also include multiple coatings. If the coatings are consumed during contact with the plasma, the coatings could be introduced into the plasma sequentially, from the outer coating to the innermost coating, thereby creating a time-release mechanism. Thus, a coated plasma catalyst can include any number of materials, as long as a portion of the catalyst is at least electrically semi-conductive.

Consistent with another embodiment of this invention, a plasma catalyst can be located entirely within a radiation cavity to substantially reduce or prevent radiation energy leakage. In this way, the plasma catalyst does not electrically or magnetically couple with the vessel containing the cavity or to any electrically conductive object outside the cavity. This prevents sparking at the ignition port and prevents radiation from leaking outside the cavity during the ignition and possibly later if the plasma is sustained. In one embodiment, the catalyst can be located at a tip of a substantially electrically non-conductive extender that extends through an ignition port.

Figure 6:
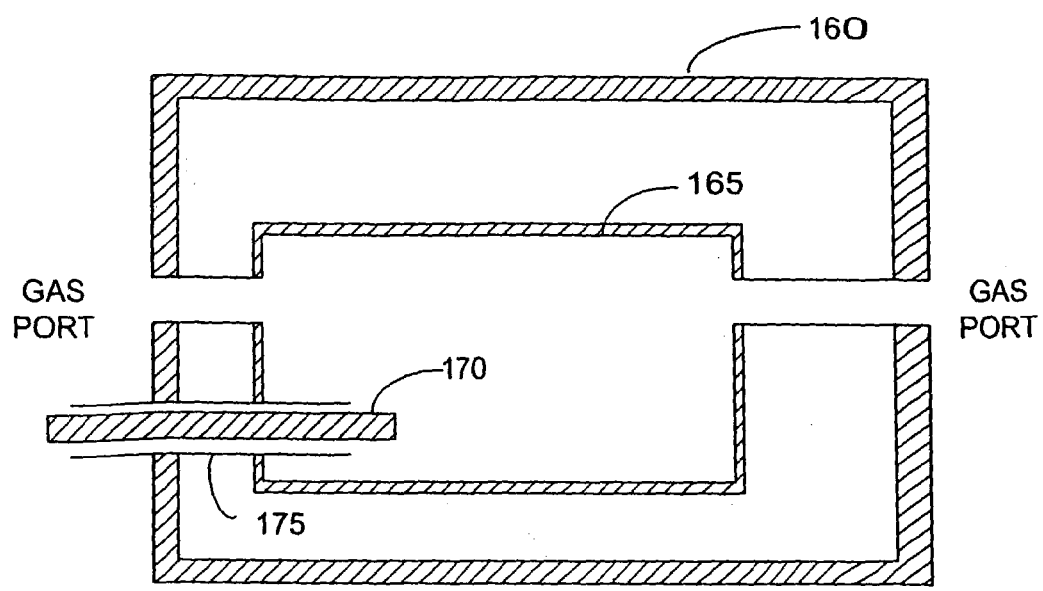
FIG. 6 shows an illustrative embodiment of another portion of a plasma system including an elongated plasma catalyst that extends through an ignition port consistent with this invention.
Figure 7:
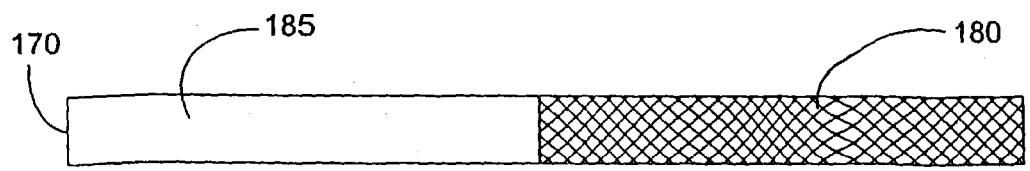
FIG. 7 shows an illustrative embodiment of an elongated plasma catalyst that can be used in the system of FIG. 6 consistent with this invention.

FIG. 6, for example, shows radiation chamber 160 in which plasma cavity 165 is placed. Plasma catalyst 170 is elongated and extends through ignition port 175. As shown in FIG. 7, and consistent with this invention, catalyst 170 can include electrically conductive distal portion 180 (which is placed in chamber 160) and electrically non-conductive portion 185 (which is placed substantially outside chamber 160). This configuration prevents an electrical connection (e.g., sparking) between distal portion 180 and chamber 160.

Figure 8:
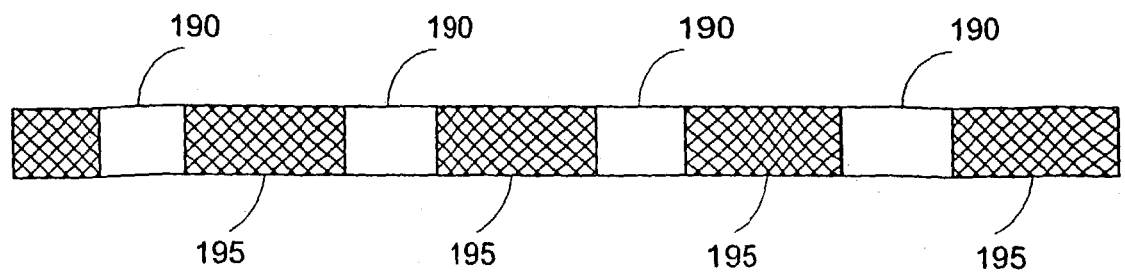
FIG. 8 shows another illustrative embodiment of an elongated plasma catalyst that can be used in the system of FIG. 6 consistent with this invention.

In another embodiment, shown in FIG. 8, the catalyst can be formed from a plurality of electrically conductive segments 190 separated by and mechanically connected to a plurality of electrically non-conductive segments 195. In this embodiment, the catalyst can extend through the ignition port between a point inside the cavity and another point outside the cavity, but the electrically discontinuous profile significantly prevents sparking and energy leakage.

Active Plasma Catalyst

Another method of forming a plasma consistent with this invention includes subjecting a gas in a cavity to electromagnetic radiation having a frequency less than about 333 GHz in the presence of an active plasma catalyst, which generates or includes at least one ionizing particle.

An active plasma catalyst consistent with this invention can be any particle or high energy wave packet capable of transferring a sufficient amount of energy to a gaseous atom or molecule to remove at least one electron from the gaseous atom or molecule in the presence of electromagnetic radiation. Depending on the source, the ionizing particles can be directed into the cavity in the form of a focused or collimated beam, or they may be sprayed, spewed, sputtered, or otherwise introduced.

Figure 9:
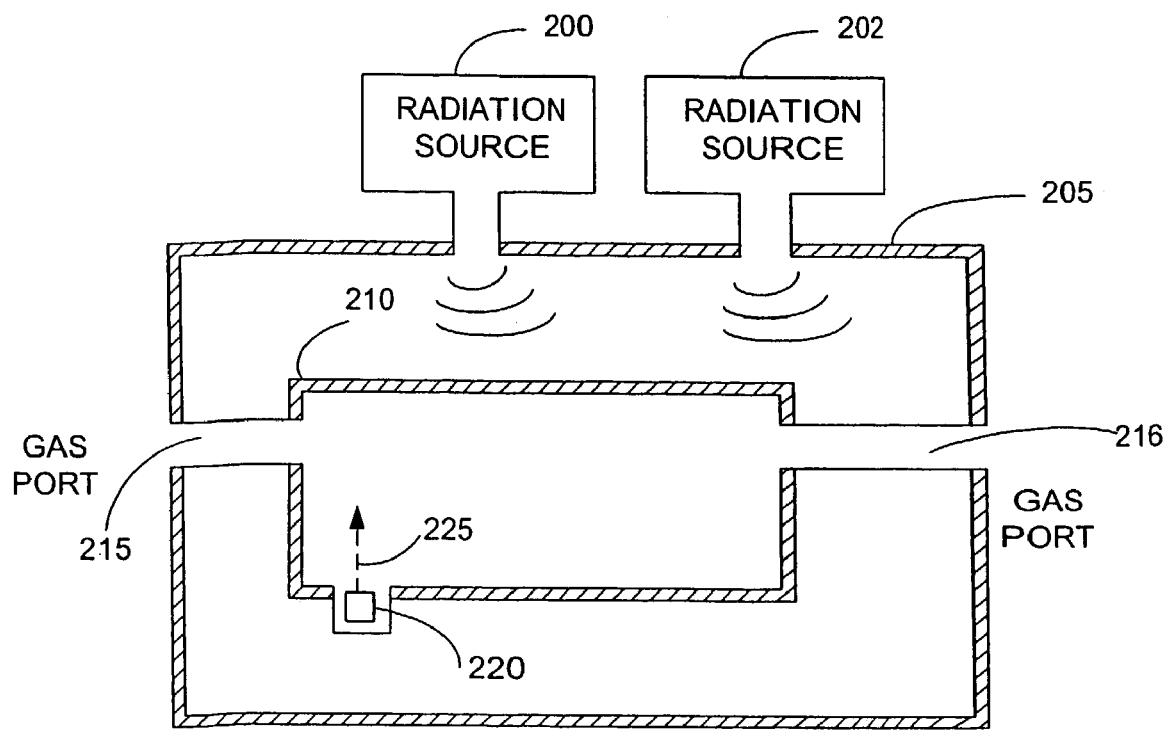
FIG. 9 shows an illustrative embodiment of a portion of a plasma system for directing ionizing radiation into a radiation chamber consistent with this invention.

For example, FIG. 9 shows radiation source 200 and radiation source 202 for directing radiation into radiation chamber 205. Plasma cavity 210 is positioned inside of chamber 205 and may permit a gas to flow therethrough via ports 215 and 216. Source 220 directs ionizing particles 225 into cavity 210. Source 220 can be protected, for example, by a metallic screen which allows the ionizing particles to pass through but shields source 220 from radiation. If necessary, source 220 can be water-cooled. In one embodiment, radiation source 200 may be activated and then, after a plasma is formed, radiation source 202 may be activated. Alternatively, radiation source 202 may be activated after a predetermined interval.

Examples of ionizing particles consistent with this invention can include x-ray particles, gamma ray particles, alpha particles, beta particles, neutrons, protons, and any combination thereof. Thus, an ionizing particle catalyst can be charged (e.g., an ion from an ion source) or uncharged and can be the product of a radioactive fission process. In one embodiment, the vessel in which the plasma cavity is formed could be entirely or partially transmissive to the ionizing particle catalyst. Thus, when a radioactive fission source is located outside the cavity, the source can direct the fission products through the vessel to ignite the plasma. The radioactive fission source can be located inside the radiation chamber to substantially prevent the fission products (i.e., the ionizing particle catalyst) from creating a safety hazard.

In another embodiment, the ionizing particle can be a free electron, but it need not be emitted in a radioactive decay process. For example, the electron can be introduced into the cavity by energizing the electron source (such as a metal), such that the electrons have sufficient energy to escape from the source. The electron source can be located inside the cavity, adjacent the cavity, or even in the cavity wall. It will be appreciated by those of ordinary skill in the art that any combination of electron sources is possible. A common way to produce electrons is to heat a metal, and these electrons can be further accelerated by applying an electric field.

In addition to electrons, free energetic protons can also be used to catalyze a plasma. In one embodiment, a free proton can be generated by ionizing hydrogen and, optionally, accelerated with an electric field.

Multi-Mode Radiation Cavities

A radiation waveguide, cavity, or chamber can support or facilitate propagation of at least one electromagnetic radiation mode. As used herein, the term "mode" refers to a particular pattern of any standing or propagating electromagnetic wave that satisfies Maxwell's equations and the applicable boundary conditions (e.g., of the cavity). In a waveguide or cavity, the mode can be any one of the various possible patterns of propagating or standing electromagnetic fields. Each mode is characterized by its frequency and polarization of the electric field and/or the magnetic field vectors. The electromagnetic field pattern of a mode depends on the frequency, refractive indices or dielectric constants, and waveguide or cavity geometry.

A transverse electric (TE) mode is one whose electric field vector is normal to the direction of propagation. Similarly, a transverse magnetic (TM) mode is one whose magnetic field vector is normal to the direction of propagation. A transverse electric and magnetic (TEM) mode is one whose electric and magnetic field vectors are both normal to the direction of propagation. A hollow metallic waveguide does not typically support a normal TEM mode of radiation propagation. Even though radiation appears to travel along the length of a waveguide, it may do so only by reflecting off the inner walls of the waveguide at some angle. Hence, depending upon the propagation mode, the radiation (e.g., microwave) may have either some electric field component or some magnetic field component along the axis of the waveguide (often referred to as the z-axis).

The actual field distribution inside a cavity or waveguide is a superposition of the modes therein. Each of the modes can be identified with one or more subscripts (e.g., $TE_{10}$ ("tee ee one zero"). The subscripts normally specify how many "half waves" at the guide wavelength are contained in the x and y directions. It will be appreciated by those skilled in the art that the guide wavelength can be different from the free space wavelength because radiation propagates inside the waveguide by reflecting at some angle from the inner walls of the waveguide. In some cases, a third subscript can be added to define the number of half waves in the standing wave pattern along the z-axis.

For a given radiation frequency, the size of the waveguide can be selected to be small enough so that it can support a single propagation mode. In such a case, the system is called a single-mode system (i.e., a single-mode applicator). The $TE_{10}$ mode is usually dominant in a rectangular single-mode waveguide.

As the size of the waveguide (or the cavity to which the waveguide is connected) increases, the waveguide or applicator can sometimes support additional higher order modes forming a multi-mode system. When many modes are capable of being supported simultaneously, the system is often referred to as highly moded.

A simple, single-mode system has a field distribution that includes at least one maximum and/or minimum. The magnitude of a maximum largely depends on the amount of radiation supplied to the system. Thus, the field distribution of a single mode system is strongly varying and substantially non-uniform.

Unlike a single-mode cavity, a multi-mode cavity can support several propagation modes simultaneously, which, when superimposed, results in a complex field distribution pattern. In such a pattern, the fields tend to spatially smear and, thus, the field distribution usually does not show the same types of strong minima and maxima field values within the cavity. In addition, as explained more fully below, a mode-mixer can be used to "stir" or "redistribute" modes (e.g., by mechanical movement of a radiation reflector). This redistribution desirably provides a more uniform time-averaged field distribution within the cavity.

A multi-mode cavity consistent with this invention can support at least two modes, and may support many more than two modes. Each mode has a maximum electric field vector. Although there may be two or more modes, one mode may be dominant and has a maximum electric field vector magnitude that is larger than the other modes. As used herein, a multi-mode cavity may be any cavity in which the ratio between the first and second mode magnitudes is less than about 1:10, or less than about 1:5, or even less than about 1:2. It will be appreciated by those of ordinary skill in the art that the smaller the ratio, the more distributed the electric field energy between the modes, and hence the more distributed the radiation energy is in the cavity.

The distribution of plasma within a processing cavity may strongly depend on the distribution of the applied radiation. For example, in a pure single mode system, there may only be a single location at which the electric field is a maximum.

Therefore, a strong plasma may only form at that single location. In many applications, such a strongly localized plasma could undesirably lead to non-uniform plasma treatment or heating (i.e., localized overheating and underheating).

Whether or not a single or multi-mode cavity is used consistent with this invention, it will be appreciated by those of ordinary skill in the art that the cavity in which the plasma is formed can be completely closed or partially open. For example, in certain applications, such as in plasma-assisted furnaces, the cavity could be entirely closed. See, for example, commonly owned, concurrently filed PCT Application No. PCT/US03/14133, which is fully incorporated herein by reference. In other applications, however, it may be desirable to flow a gas through the cavity, and therefore the cavity must be open to some degree. In this way, the flow, type, and pressure of the flowing gas can be varied over time. This may be desirable because certain gases with lower ionization potentials, such as argon, are easier to ignite but may have other undesirable properties during subsequent plasma processing.

Mode-Mixing

For many applications, a cavity containing a uniform plasma is desirable. However, because microwave radiation can have a relatively long wavelength (e.g., several tens of centimeters), obtaining a uniform distribution can be difficult to achieve. As a result, consistent with one aspect of this invention, the radiation modes in a multi-mode cavity can be mixed, or redistributed, over a period of time. Because the field distribution within the cavity must satisfy all of the boundary conditions set by the inner surface of the cavity, those field distributions can be changed by changing the position of any portion of that inner surface.

In one embodiment consistent with this invention, a movable reflective surface can be located inside the radiation cavity. The shape and motion of the reflective surface should, when combined, change the inner surface of the cavity during motion. For example, an "L" shaped metallic object (i.e., "mode-mixer") when rotated about any axis will change the location or the orientation of the reflective surfaces in the cavity and therefore change the radiation distribution therein. Any other asymmetrically shaped object can also be used (when rotated), but symmetrically shaped objects can also work, as long as the relative motion (e.g., rotation, translation, or a combination of both) causes some change in the location or the orientation of the reflective surfaces. In one embodiment, a mode-mixer can be a cylinder that is rotatable about an axis that is not the cylinder's longitudinal axis.

Each mode of a multi-mode cavity may have at least one maximum electric field vector, but each of these vectors could occur periodically across the inner dimension of the cavity. Normally, these maxima are fixed, assuming that the frequency of the radiation does not change. However, by moving a mode-mixer such that it interacts with the radiation, it is possible to move the positions of the maxima. For example, mode-mixer 38 can be used to optimize the field distribution within cavity 14 such that the plasma ignition conditions and/or the plasma sustaining conditions are optimized. Thus, once a plasma is excited, the position of the mode-mixer can be changed to move the position of the maxima for a uniform time-averaged plasma process (e.g., heating).

Thus, consistent with this invention, mode-mixing can be useful during plasma ignition. For example, when an electrically conductive fiber is used as a plasma catalyst, it is known that the fiber's orientation can strongly affect the minimum plasma-ignition conditions. It has been reported, for example, that when such a fiber is oriented at an angle that is greater than 60° to the electric field, the catalyst does little to improve, or relax, these conditions. By moving a reflective surface either in or near the cavity, however, the electric field distribution can be significantly changed.

Mode-mixing can also be achieved by launching the radiation into the applicator chamber through, for example, a rotating waveguide joint that can be mounted inside the applicator chamber. The rotary joint can be mechanically moved (e.g., rotated) to effectively launch the radiation in different directions in the radiation chamber. As a result, a changing field pattern can be generated inside the applicator chamber.

Mode-mixing can also be achieved by launching radiation in the radiation chamber through a flexible waveguide. In one embodiment, the waveguide can be mounted inside the chamber. In another embodiment, the waveguide can extend into the chamber. The position of the end portion of the flexible waveguide can be continually or periodically moved (e.g., bent) in any suitable manner to launch the radiation (e.g., microwave radiation) into the chamber at different directions and/or locations. This movement can also result in mode-mixing and facilitate more uniform plasma processing (e.g., heating) on a time-averaged basis. Alternatively, this movement can be used to optimize the location of a plasma for ignition or other plasma-assisted process.

If the flexible waveguide is rectangular, a simple twisting of the open end of the waveguide will rotate the orientation of the electric and the magnetic field vectors in the radiation inside the applicator chamber. Then, a periodic twisting of the waveguide can result in mode-mixing as well as rotating the electric field, which can be used to assist ignition, modulation, or sustaining of a plasma.

Thus, even if the initial orientation of the catalyst is perpendicular to the electric field, the redirection of the electric field vectors can change the ineffective orientation to a more effective one. Those skilled in the art will appreciate that mode-mixing can be continuous, periodic, or preprogrammed.

In addition to plasma ignition, mode-mixing can be useful during subsequent plasma processing to reduce or create (e.g., tune) "hot spots" in the chamber. When a microwave cavity only supports a small number of modes (e.g., less than 5), one or more localized electric field maxima can lead to "hot spots" (e.g., within cavity 12). In one embodiment, these hot spots could be configured to coincide with one or more separate, but simultaneous, plasma ignitions or processing events. Thus, the plasma catalyst can be located at one or more of those ignition or subsequent processing positions.

Multi-Location Ignition

A plasma can be ignited using multiple plasma catalysts at different locations. In one embodiment, multiple fibers can be used to ignite the plasma at different points within the cavity. Such multi-point ignition can be especially beneficial when a uniform plasma ignition is desired. For example, when a plasma is modulated at a high frequency (i.e., tens of Hertz and higher), or ignited in a relatively large volume, or both, substantially uniform instantaneous striking and restriking off the plasma can be improved. Alternatively, when plasma catalysts are used at multiple points, they can be used to sequentially ignite a plasma at different locations within a plasma chamber by selectively introducing the catalyst at those different locations. In this way, a plasma ignition gradient can be controllably formed within the cavity, if desired.

Also, in a multi-mode cavity, random distribution of the catalyst throughout multiple locations in the cavity increases the likelihood that at least one of the fibers, or any other passive plasma catalyst consistent with this invention, is optimally oriented with the electric field lines. Still, even where the catalyst is not optimally oriented (not substantially aligned with the electric field lines), the ignition conditions are improved.

Furthermore, because a catalytic powder can be suspended in a gas, it is believed that each powder particle may have the effect of being placed at a different physical location within the cavity, thereby improving ignition uniformity within the cavity.

Dual-Cavity Plasma Igniting/Sustaining

A dual-cavity arrangement can be used to ignite and sustain a plasma consistent with this invention. In one embodiment, a system includes at least a first ignition cavity and a second cavity in fluid communication with the first cavity. To ignite a plasma, a gas in the first ignition cavity can be subjected to electromagnetic radiation having a frequency less than about 333 GHz, optionally in the presence of a plasma catalyst. In this way, the proximity of the first and second cavities may permit a plasma formed in the first cavity to ignite a plasma in the second cavity, which may be sustained with additional electromagnetic radiation.

In one embodiment of this invention, the first cavity can be very small and designed primarily, or solely for plasma ignition. In this way, very little microwave energy may be required to ignite the plasma, permitting easier ignition, especially when a plasma catalyst is used consistent with this invention.

In one embodiment, the first cavity may be a substantially single mode cavity and the second cavity is a multi-mode cavity. When the first ignition cavity only supports a single mode, the electric field distribution may strongly vary within the cavity, forming one or more precisely located electric field maxima. Such maxima are normally the first locations at which plasmas ignite, making them ideal points for placing plasma catalysts. It will be appreciated, however, that when a plasma catalyst is used, it need not be placed in the electric field maximum and, many cases, need not be oriented in any particular direction.

In the foregoing described embodiments, in some instances, various features may be grouped together in a single embodiment for purposes of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description of Embodiments, with each claim standing on its own as a separate preferred embodiment of the invention.

We claim:

1. A radiation apparatus, comprising:
   a radiation cavity;
   a first radiation source for directing electromagnetic radiation having a frequency less than about 333 GHz into the cavity to facilitate formation of plasma in the cavity;
   a second radiation source for directing electromagnetic radiation into the cavity;
   a controller for sequentially activating the second radiation source after the first radiation source is activated; and a detector that provides an indication of radiation absorption, and wherein the controller delays activation of the second radiation source until after the controller receives a signal from the detector that a predetermined absorption level has been reached.

2. The apparatus of claim 1, further comprising at least one additional radiation source, and wherein the controller is configured to activate the additional radiation source only after at least one of the first and second radiation sources is activated.

3. The apparatus of claim 1, further comprising a plurality of additional radiation sources, and wherein the controller is configured to activate each of the plurality of additional radiation sources only after at least one of the first and second radiation sources is activated.

4. The apparatus of claim 1, wherein the controller delays activation of the second radiation source for a predetermined period following activation of the first radiation source.

5. The apparatus of claim 1, wherein the first radiation source is configured to generate radiation that is cross-polarized relative to radiation generated by the second radiation source.

6. The apparatus of claim 1, wherein each of the first radiation source and the second radiation source comprises at least one of a magnetron, a klystron, a gyrotron, a traveling-wave tube amplifier, and any other source of radiation.

7. The apparatus of claim 1, further comprising a catalyst located proximate the cavity, for cooperating with the radiation to cause the gas to form a plasma.

8. The apparatus of claim 7, wherein the catalyst is at least one of an active catalyst and a passive catalyst.

9. The method of claim 8, wherein the catalyst comprises at least one of metal, inorganic material, carbon, carbon-based alloy, carbon-based composite, electrically conductive polymer, conductive silicone elastomer, polymer nanocomposite, and an organic-inorganic composite.

10. The method of claim 9, wherein the catalyst is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, and a whisker.

11. The method of claim 10, wherein the catalyst comprises carbon fiber.

12. The method of claim 8, wherein the catalyst is in the form of at least one of a nato-particle, a nano-tube, a powder, a dust, a flake, a fiber, a sheet, a needle, a thread, a strand, a filament, a yarn, a twine, a shaving, a sliver, a chip, a woven fabric, a tape, and a whisker.

13. The apparatus of claim 1, further comprising an isolator for protectively separating the second radiation source from the first radiation source.

14. A plasma apparatus, comprising:
    a chamber;
    a conduit for supplying a gas to the chamber;
    a plurality of radiation sources arranged to radiate electromagnetic radiation into the chamber;
    a controller for delaying activation of all but a first of the plurality radiation sources until after a first radiation source is activated; and
    a detector that provides an indication of radiation absorption, and wherein the controller delays activation of each one of the plurality of radiation sources until after the controller receives a signal from the detector that a predetermined absorption level has been reached.

15. The plasma apparatus of claim 14, wherein the controller delays activation of at least one of the plurality of radiation sources for a predetermined period following activation of the first radiation source and wherein each of the remaining plurality of radiation sources is successively activated at predetermined intervals.

16. The plasma apparatus of claim 14, wherein the first radiation source is configured to generate radiation that is cross-polarized relative to radiation generated by at least one of the plurality of radiation sources.

17. The plasma apparatus of claim 14, wherein each of the first radiation source and each one of the plurality radiation sources comprises at least one of a magnetron, a klystron, a gyrotron, a traveling-wave tube amplifier/oscillator, and any other source of radiation.

18. The plasma apparatus of claim 14, further comprising a catalyst located proximate the cavity, for cooperating with the radiation to cause the gas to form a plasma.

19. The plasma apparatus of claim 18, wherein the catalyst is at least one of an active catalyst and a passive catalyst.

20. The plasma apparatus of claim 19, wherein the catalyst comprises at least one of metal, inorganic material, carbon, carbon-based alloy, carbon-based composite, electrically conductive polymer, conductive silicone elastomer, polymer nanocomposite, and an organic-inorganic composite.

21. The plasma apparatus of claim 20, wherein the catalyst is in the form of at least one of a nanoparticle, a nano-tube, a powder, a dust, a flake, a fiber, a sheet, a needle, a thread, a strand, a filament, a yarn, a twine, a shaving, a sliver, a chip, a woven fabric, a tape, and a whisker.

22. The plasma apparatus of claim 21, wherein the catalyst comprises carbon fiber.

23. The plasma apparatus of claim 19, wherein the catalyst is in the form of at least one of a nanoparticle, a nano-tube, a powder, a dust, a flake, a fiber, a sheet, a needle, a thread, a strand, a filament, a yarn, a twine, a shaving, a sliver, a chip, a woven fabric, a tape, and a whisker.

24. The plasma apparatus of claim 19 wherein the plasma catalyst comprises an active plasma catalyst including at least one ionizing particle.

25. The plasma apparatus of claim 24, wherein the at least one ionizing particle comprises a beam of particles.

26. The plasma apparatus of claim 24, wherein the particle is at least one of an x-ray particle, a gamma ray particle, an alpha particle, a beta particle, a neutron, and a proton.

27. The plasma apparatus of claim 24, wherein the at least one ionizing particle is a charged particle.

28. The plasma apparatus of claim 24, wherein the ionizing particle comprises a radioactive fission product.

29. The plasma apparatus of claim 14, further comprising a plurality of isolators for protectively separating each one of the plurality of radiation sources from each other and from the first radiation source.

30. The plasma apparatus of claim 14, wherein the chamber is a waveguide.

* * * * *

UNITED STATES PATENT AND TRADEMARK OFFICE
CERTIFICATE OF CORRECTION

PATENT NO. : 7,227,097 B2
APPLICATION NO. : 10/430415
DATED : June 5, 2007
INVENTOR(S) : Satyendra Kumar et al.

It is certified that error appears in the above-identified patent and that said Letters Patent is hereby corrected as shown below:

Column 1, line 10, "herein reference." should read --herein by reference.--;

Column 5, line 16, "and/or (e.g., 5" should read --and/or OSHA (e.g., 5--;

Column 17, claim 1, line 63, "cavity;" should read --cavity; and--;

Column 18, claim 5, line 17, "first radiation" should read --first microwave radiation--;

Column 18, claim 9, line 31, "The method of claim 8," should read --The apparatus of claim 8,--;

Column 18, claim 10, line 36, "The method of claim 9," should read --The apparatus of claim 9,--;

Column 18, claim 11, line 41, "The method of claim 10," should read --The apparatus of claim 10,--;

Column 18, claim 12, line 43, "The method of claim 8," should read --The apparatus of claim 8,--;

Column 18, claim 12, line 44, "nato-particle" should read --nano-particle--;

Column 18, claim 14, line 57, "plurality radiation" should read --plurality of radiation--; and

UNITED STATES PATENT AND TRADEMARK OFFICE
CERTIFICATE OF CORRECTION

PATENT NO.         : 7,227,097 B2
APPLICATION NO. : 10/430415
DATED                : June 5, 2007
INVENTOR(S)       : Satyendra Kumar et al.

It is certified that error appears in the above-identified patent and that said Letters Patent is hereby corrected as shown below:

Column 19, claim 17, line 8, "plurality radiation" should read --plurality of radiation--.

Signed and Sealed this

Twenty-ninth Day of September, 2009

David J. Kappos
*Director of the United States Patent and Trademark Office*